(12) United States Patent  
Xu et al.

(10) Patent No.: US 8,481,396 B2
(45) Date of Patent: Jul. 9, 2013

(54) MEMORY CELL THAT INCLUDES A CARBON-BASED REVERSIBLE RESISTANCE SWITCHING ELEMENT COMPATIBLE WITH A STEERING ELEMENT, AND METHODS OF FORMING THE SAME

(75) Inventors: Huiwen Xu, Sunnyvale, CA (US); Er-Xuan Ping, Fremont, CA (US); Xiying Costa, San Jose, CA (US); Thomas J. Kwon, Dublin, CA (US)

(73) Assignee: SanDisk 3D LLC, Milpitas, CA (US)

( * ) Notice: Subject to any disclaimer, the term of this patent is extended or adjusted under 35 U.S.C. 154(b) by 247 days.

(21) Appl. No.: 12/835,236

(22) Filed: Jul. 13, 2010

(65) Prior Publication Data

US 2011/0095258 A1 Apr. 28, 2011

Related U.S. Application Data

(60) Provisional application No. 61/254,631, filed on Oct. 23, 2009.

(51) Int. Cl.
*H01L 21/00* (2006.01)

(52) U.S. Cl.
USPC ............................. 438/382; 438/255; 438/597

(58) Field of Classification Search
USPC ......................................... 438/382, 255, 597
See application file for complete search history.

(56) References Cited

U.S. PATENT DOCUMENTS

| | | | |
|---|---|---|---|
| 4,599,705 A | 7/1986 | Holmberg et al. | |
| 5,406,509 A | 4/1995 | Ovshinsky et al. | |
| 5,687,112 A | 11/1997 | Ovshinsky | |
| 5,751,012 A | 5/1998 | Wolsteinholme et al. | |
| 5,825,046 A | 10/1998 | Czubatyj et al. | |
| 5,831,276 A | 11/1998 | Gonzalez et al. | |
| 5,915,167 A | 6/1999 | Leedy | |
| 5,952,671 A | 9/1999 | Reinberg et al. | |
| 6,071,597 A | 6/2000 | Yang et al. | |
| 6,100,193 A | 8/2000 | Suehiro et al. | |
| 6,114,713 A | 9/2000 | Zahorik | |

(Continued)

FOREIGN PATENT DOCUMENTS

| | | |
|---|---|---|
| EP | 0 028 707 | 5/1981 |
| EP | 1 892 722 | 2/2008 |

(Continued)

OTHER PUBLICATIONS

International Search Report and Written Opinion of International Application No. PCT/US2010/052859 dated Feb. 7, 2011.

(Continued)

*Primary Examiner* — Laura Menz

(74) *Attorney, Agent, or Firm* — Dugan & Dugan, PC

(57) ABSTRACT

Memory cells, and methods of forming such memory cells, are provided that include a steering element coupled to a carbon-based reversible resistivity switching material that has an increased resistivity, and a switching current that is less than a maximum current capability of the steering element used to control current flow through the carbon-based reversible resistivity switching material. In particular embodiments, methods and apparatus in accordance with this invention form a steering element, such as a diode, having a first cross-sectional area, coupled to a reversible resistivity switching material, such as aC, having a region that has a second cross-sectional area smaller than the first cross-sectional area.

17 Claims, 19 Drawing Sheets

U.S. PATENT DOCUMENTS

| | | |
|---|---|---|
| 6,214,107 B1 | 4/2001 | Kitabatake |
| 6,369,431 B1* | 4/2002 | Gonzalez et al. ............ 257/390 |
| 6,388,933 B2 | 5/2002 | Marr |
| 6,563,220 B2* | 5/2003 | Gonzalez et al. ............ 257/758 |
| 6,643,159 B2 | 11/2003 | Fricke et al. |
| 6,670,713 B2* | 12/2003 | Gonzalez et al. ............ 257/758 |
| 6,744,088 B1 | 6/2004 | Dennison |
| 6,841,846 B1 | 1/2005 | Chen et al. |
| 6,885,021 B2 | 4/2005 | Apodaca et al. |
| 6,937,507 B2 | 8/2005 | Chen |
| 6,952,030 B2 | 10/2005 | Herner |
| 6,960,495 B2 | 11/2005 | Vyvoda et al. |
| 6,984,561 B2 | 1/2006 | Herner et al. |
| 6,995,422 B2 | 2/2006 | Herner et al. |
| 7,009,275 B2 | 3/2006 | Herner et al. |
| 7,026,212 B2 | 4/2006 | Herner et al. |
| 7,084,062 B1 | 8/2006 | Avanzino et al. |
| 7,176,064 B2 | 2/2007 | Herner |
| 7,205,562 B2 | 4/2007 | Wicker |
| 7,238,607 B2 | 7/2007 | Dunton et al. |
| 7,259,038 B2 | 8/2007 | Scheuerlein et al. |
| 7,265,049 B2 | 9/2007 | Herner et al. |
| 7,271,440 B2 | 9/2007 | Harshfield |
| 7,285,464 B2 | 10/2007 | Herner et al. |
| 7,301,191 B1 | 11/2007 | Tombler et al. |
| 7,345,296 B2 | 3/2008 | Tombler, Jr. et al. |
| 7,361,586 B2 | 4/2008 | Adem et al. |
| 7,405,465 B2 | 7/2008 | Herner |
| 7,417,245 B2 | 8/2008 | Happ et al. |
| 7,426,128 B2 | 9/2008 | Scheuerlein |
| 7,483,285 B2 | 1/2009 | Furukawa et al. |
| 7,575,984 B2 | 8/2009 | Radigan |
| 7,602,042 B2 | 10/2009 | Ahn et al. |
| 7,705,343 B2 | 4/2010 | Suh et al. |
| 7,728,405 B2 | 6/2010 | Kreupl |
| 7,830,698 B2* | 11/2010 | Chen et al. .................... 365/148 |
| 7,955,981 B2* | 6/2011 | Chen et al. .................... 438/689 |
| 8,023,310 B2* | 9/2011 | Fu et al. ........................ 365/148 |
| 8,039,919 B2 | 10/2011 | Moon et al. |
| 8,093,123 B2* | 1/2012 | Xu et al. ........................ 438/255 |
| 8,114,765 B2* | 2/2012 | Xu et al. ........................ 438/597 |
| 8,206,995 B2 | 6/2012 | Reyes et al. |
| 2003/0073295 A1 | 4/2003 | Xu |
| 2004/0159835 A1 | 8/2004 | Krieger et al. |
| 2004/0251551 A1 | 12/2004 | Hideki |
| 2005/0052915 A1 | 3/2005 | Herner et al. |
| 2005/0158950 A1 | 7/2005 | Scheuerlein et al. |
| 2005/0226067 A1 | 10/2005 | Herner et al. |
| 2006/0046407 A1 | 3/2006 | Juengling |
| 2006/0097342 A1 | 5/2006 | Parkinson |
| 2006/0118782 A1 | 6/2006 | Zettl et al. |
| 2006/0175596 A1 | 8/2006 | Happ et al. |
| 2006/0250836 A1 | 11/2006 | Herner |
| 2006/0258109 A1 | 11/2006 | Juengling |
| 2006/0273298 A1 | 12/2006 | Petti |
| 2007/0034936 A1 | 2/2007 | Van Schaijk et al. |
| 2007/0123053 A1* | 5/2007 | Kim et al. ..................... 438/736 |
| 2007/0190722 A1 | 8/2007 | Herner |
| 2008/0017894 A1 | 1/2008 | Happ et al. |
| 2008/0070162 A1 | 3/2008 | Ufert |
| 2008/0116441 A1 | 5/2008 | Raghuram |
| 2008/0173858 A1 | 7/2008 | An et al. |
| 2008/0217732 A1 | 9/2008 | Kreupl |
| 2008/0232160 A1* | 9/2008 | Gopalakrishnan ............ 365/163 |
| 2009/0108368 A1 | 4/2009 | Kanegae et al. |
| 2009/0168491 A1 | 7/2009 | Schricker |
| 2009/0201715 A1* | 8/2009 | Kreupl .......................... 365/148 |
| 2009/0257265 A1* | 10/2009 | Chen et al. .................... 365/148 |
| 2009/0257270 A1* | 10/2009 | Schricker et al. ............. 365/148 |
| 2009/0262572 A1 | 10/2009 | Krusin-Elbaum |
| 2009/0294832 A1 | 12/2009 | Kakoschke et al. |
| 2010/0006811 A1* | 1/2010 | Xu et al. ......................... 257/2 |
| 2010/0006812 A1* | 1/2010 | Xu et al. ......................... 257/2 |
| 2010/0012914 A1* | 1/2010 | Xu et al. ......................... 257/2 |
| 2010/0032638 A1* | 2/2010 | Xu ................................. 257/2 |
| 2010/0032639 A1* | 2/2010 | Xu ................................. 257/2 |
| 2010/0032640 A1* | 2/2010 | Xu ................................. 257/2 |
| 2010/0032643 A1* | 2/2010 | Xu ................................. 257/4 |
| 2010/0038620 A1* | 2/2010 | Xu et al. ......................... 257/3 |
| 2010/0038623 A1* | 2/2010 | Xu et al. ......................... 257/4 |
| 2010/0081268 A1* | 4/2010 | Schricker et al. ............. 438/600 |
| 2010/0102291 A1* | 4/2010 | Xu ................................. 257/4 |
| 2010/0108976 A1 | 5/2010 | Jayasekara et al. |
| 2010/0108982 A1* | 5/2010 | Ping et al. ...................... 257/5 |
| 2010/0163824 A1* | 7/2010 | Xu et al. ......................... 257/2 |
| 2010/0176366 A1* | 7/2010 | Fu et al. ......................... 257/4 |
| 2010/0193916 A1* | 8/2010 | Xu et al. ....................... 257/618 |
| 2010/0291747 A1 | 11/2010 | Lung et al. |
| 2010/0327254 A1* | 12/2010 | Chen et al. ...................... 257/5 |
| 2011/0037045 A1* | 2/2011 | Fukumizu et al. ................ 257/3 |
| 2011/0095257 A1* | 4/2011 | Xu et al. ......................... 257/3 |
| 2011/0095258 A1* | 4/2011 | Xu et al. ......................... 257/3 |
| 2011/0117679 A1 | 5/2011 | Lee et al. |
| 2011/0204313 A1* | 8/2011 | Chen et al. ...................... 257/4 |
| 2011/0204474 A1* | 8/2011 | Kreupl et al. ................. 257/532 |
| 2011/0210306 A1* | 9/2011 | Li et al. .......................... 257/3 |
| 2011/0278529 A1* | 11/2011 | Xu ................................. 257/2 |
| 2012/0135603 A1* | 5/2012 | Xu et al. ....................... 438/694 |

FOREIGN PATENT DOCUMENTS

| | | |
|---|---|---|
| EP | 1 916 722 | 4/2008 |
| JP | 2009 218259 | 9/2009 |
| WO | WO 2004/070735 | 8/2004 |
| WO | WO 2006/078505 A2 | 7/2006 |
| WO | WO 2008/078197 | 7/2008 |
| WO | WO 2009/043023 A2 | 4/2009 |
| WO | WO 2009/088889 | 7/2009 |
| WO | WO 2009/110120 | 9/2009 |
| WO | WO 2009/126846 | 10/2009 |
| WO | WO 2009/126891 | 10/2009 |
| WO | WO 2010/017428 | 2/2010 |

OTHER PUBLICATIONS

Li et al., "Electronic Two-Terminal Bistable Graphitic Memories", Nature Materials, vol. 7, 2008, pp. 966-971.

Maxwell, U.S. Appl. No. 12/703,907, filed Feb. 11, 2010.

Li et al., U.S. Appl. No. 12/631,913, filed Dec. 7, 2009.

Franz Kreupl et al., U.S. Appl. No. 12/711,810, filed Feb. 24, 2010.

Li et al., U.S. Appl. No. 12/714,359, filed Feb. 26, 2010.

Kreupl et al., "Carbon-Based Resistive Memory", Jun. 26, 2008, IEDM 2008, pp. 1-4.

Gateru et al., "Memory Switching in Ion Bombarded Amorphous Silicon Carbide Thin Film Devices", 2003, Materials Research Society, Mat. Res. Soc. Symp. Proc., vol. 742, pp. 79-83.

Shannon et al., "Memory Switching in Amorphous Silicon-Rich Silicon Carbide", Oct. 28, 1999, Electronics Letters, vol. 35, No. 22, pp. 1976-1978.

Kreupl et al., U.S. Appl. No. 12/760,156, filed Apr. 14, 2010.

Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.

Takai et al.,"Structure and Electronic Properties of a Nongraphitic Disordered Carbon System and its Heat-Treatment Effects", Physical Review B 67, 214202, pp. 214202-1-214202-11, published Jun. 19, 2003.

Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.

Dittmer et al., "Low ambient temperature CVD growth of carbon nanotubes," Appl. Phys. A 84,243-246 (2006), p. 1, published online May 17, 2006.

Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678, Received Jun. 14, 2006.

Kong et al., "Integration of a gate electrode into carbon nanotube devices for scanning tunneling microscopy," Appl. Phys. Lett. 86, 2005, pp. 112106-1-112106-3, published online Mar. 8, 2005.

Bhattacharyya, et al., "Switching behaviour and high frequency response of amorphous carbon double-barrier structures", Aug. 2007, Materials Science and Engineering C, Elsevier Science S.A, CH, vol. 27 No. 5-8, pp. 957-960, available online Nov. 13, 2006.

Sin, C-Y et al., "Resist trimming in high-density CF4/02 Plasmas for sub-0.1 [mu]m device fabrication", Jour. Vacuum Sci. & Techno. B (Microelectronics and Nanometer Structures) AIP for American Vacuum Soc. USA, vol. 20, No. 5, pp. 1974-1981, 2002.

Eyoum, M-A et al., "Ashing Technique for Nano-Gap Fabrication of Electrostatic Transducers", Materials Research Society Symposium Proceedings; [Materials Research Society Symposium Proceedings], Materials Research Society, USA, vol. EXS-02, pp. 145-147, 2003.

International Search Report and Written Opinion of International Application No. PCT/US2010/052855 dated Feb. 2, 2011.

Nov. 8, 2012 Response to Aug. 8, 2012 Office Action of related U.S. Appl. No. 12/834,942.

Office Action of related U.S. Appl. No. 12/834,942 mailed Aug. 8, 2012.

Final Office Action of related U.S. Appl. No. 12/834,942 mailed Feb. 1, 2013.

May 1, 2013 Response to Feb. 1, 2013 Final Office Action of related U.S. Appl. No. 12/834,942.

* cited by examiner

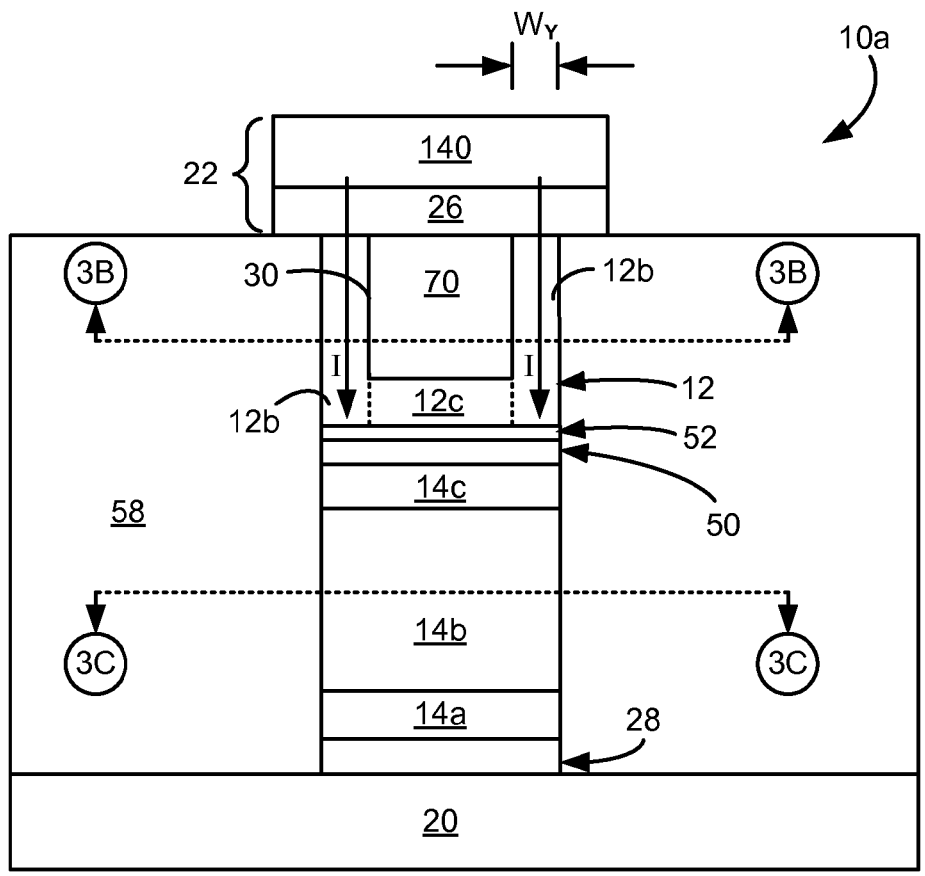
FIG. 3A
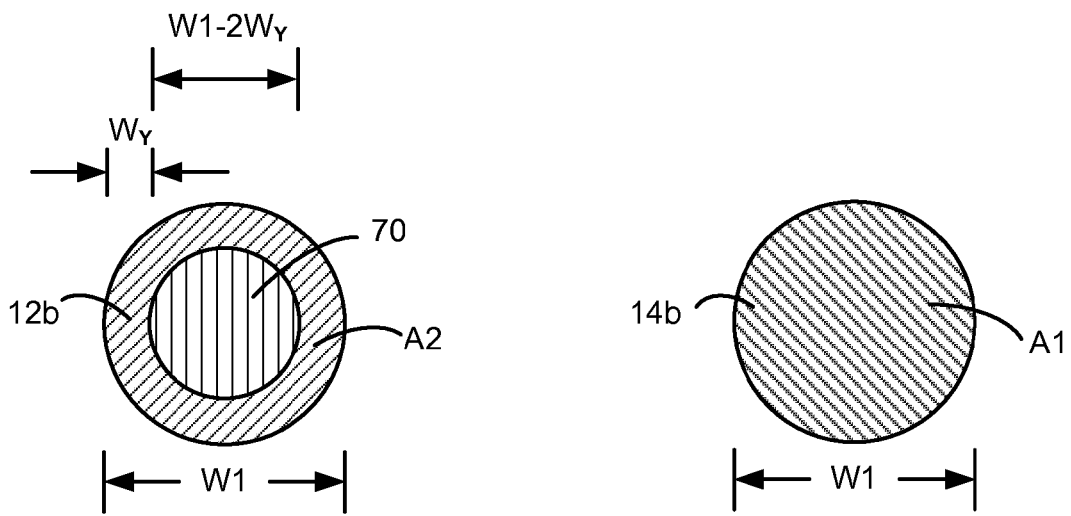
FIG. 3B  FIG. 3C

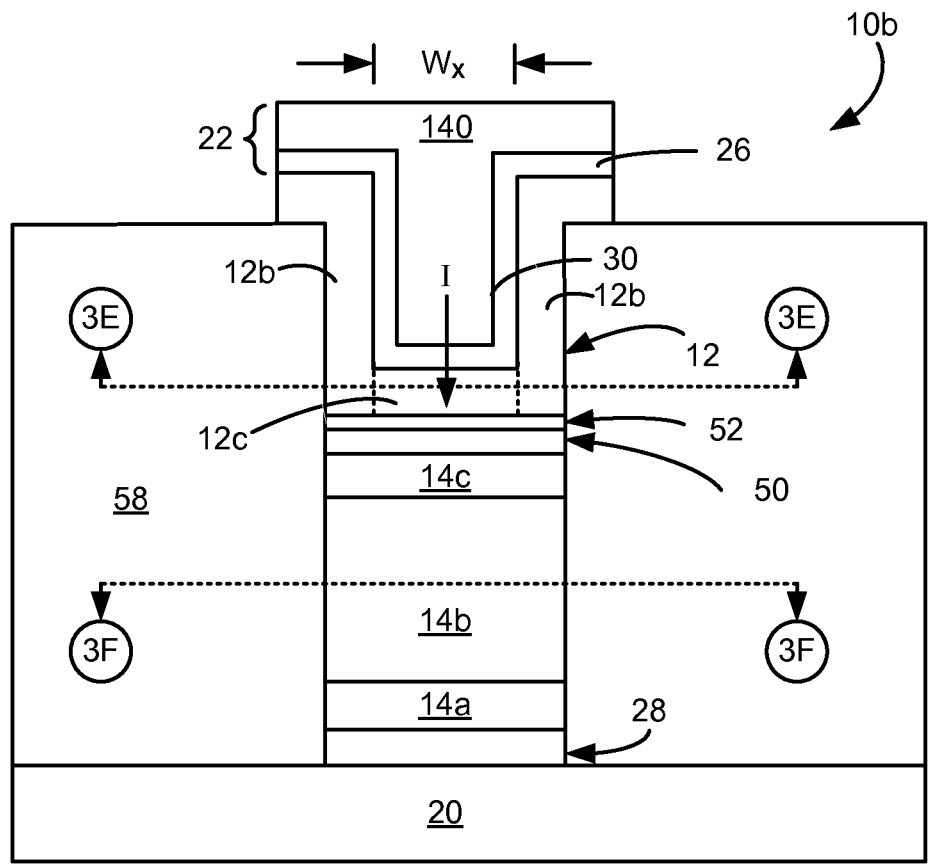
FIG. 3D
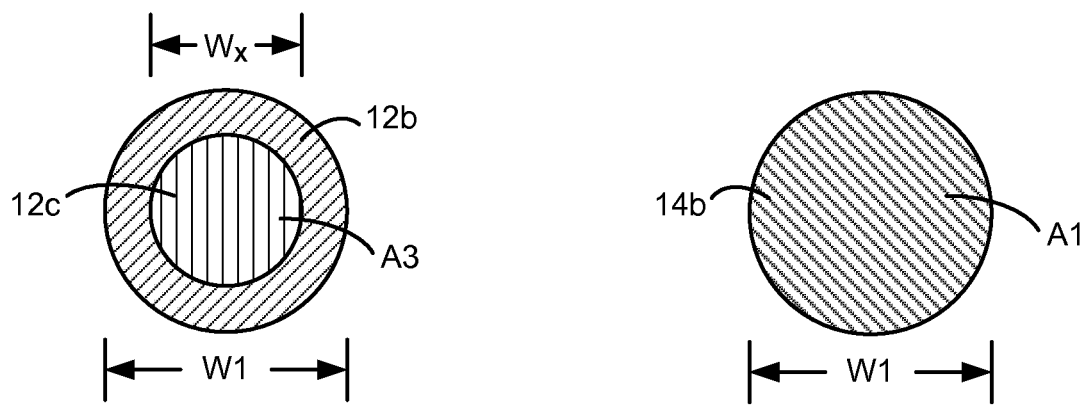
FIG. 3E   FIG. 3F

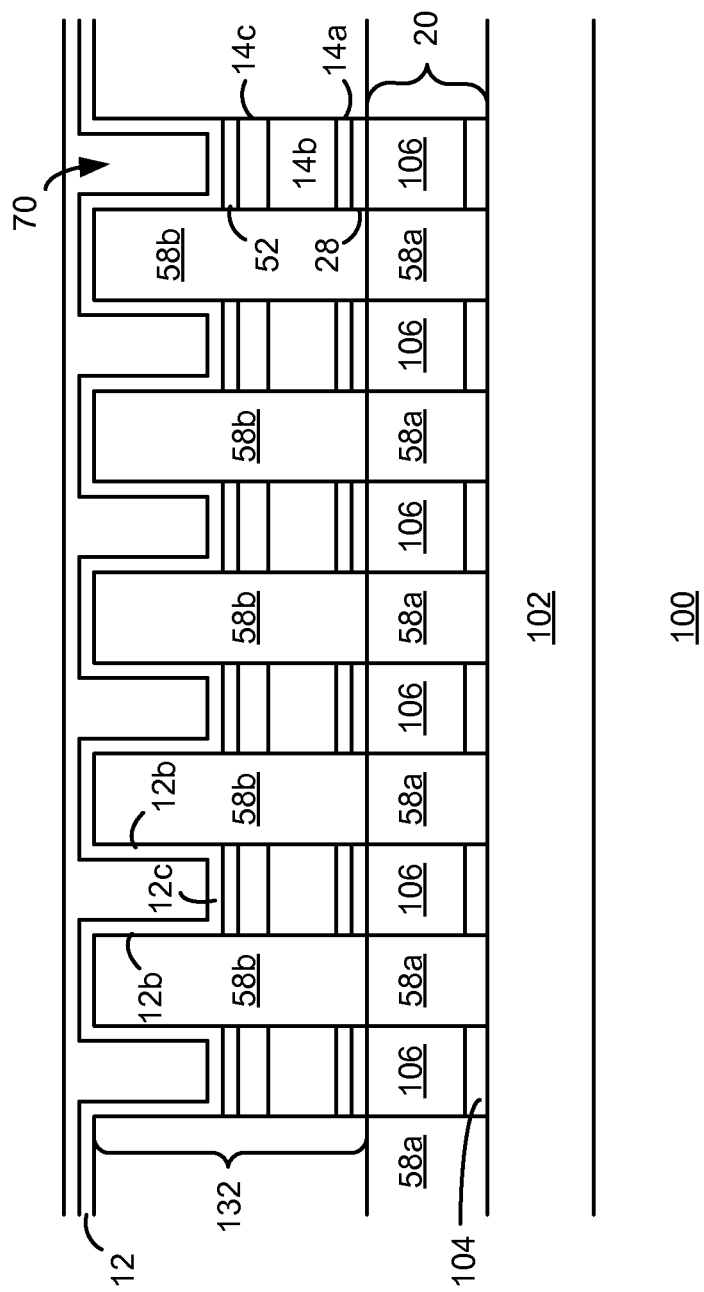

MEMORY CELL THAT INCLUDES A CARBON-BASED REVERSIBLE RESISTANCE SWITCHING ELEMENT COMPATIBLE WITH A STEERING ELEMENT, AND METHODS OF FORMING THE SAME

REFERENCE TO RELATED APPLICATIONS

This application claims the benefit of U.S. Provisional Patent Application Ser. No. 61/254,631, filed Oct. 23, 2009, and titled "A Memory Cell That Includes A Carbon-Based Reversible Resistance Switching Element Compatible With A Steering Element, And Methods Of Forming The Same," which is incorporated by reference herein in its entirety for all purposes.

This application is related to U.S. patent application Ser. No. 12/834,942, filed on even date herewith, and titled "A Memory Cell That Includes A Carbon-Based Reversible Resistance Switching Element Compatible With A Steering Element, And Methods Of Forming The Same,", which is incorporated by reference herein in its entirety for all purposes.

TECHNICAL FIELD

This invention relates to non-volatile memories, and more particularly to a memory cell that includes a carbon-based reversible resistance switching element compatible with a steering element, and methods of forming the same.

BACKGROUND

Non-volatile memories formed from reversible resistance switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 application"), which is hereby incorporated by reference herein in its entirety for all purposes, describes a rewriteable non-volatile memory cell that includes a diode coupled in series with a carbon-based reversible resistivity switching material such as carbon.

However, fabricating memory devices from rewriteable resistivity switching materials is technically challenging, and improved methods of forming memory devices that employ resistivity switching materials are desirable.

SUMMARY

In accordance with a first aspect of the invention, a method of forming a memory cell is provided, the method including forming a steering element having a first cross-sectional area, forming a reversible resistance switching element including a sidewall region and a bottom region that define a cavity, wherein the sidewall region has a cross-sectional area less than the first cross-sectional area, and forming a dielectric layer within the cavity.

In accordance with a second aspect of the invention, a method of forming a memory cell is provided, the method including forming a steering element having a first cross-sectional area, forming a reversible resistance switching element including a sidewall region and a bottom region that define a cavity, wherein the bottom region has a cross-sectional area less than the first cross-sectional area, and forming a conductive layer within the cavity.

In accordance with a third aspect of the invention, a memory cell is provided that includes a steering element having a first cross-sectional area, a reversible resistance switching element including a sidewall region and a bottom region that define a cavity, wherein the sidewall region has a cross-sectional area less than the first cross-sectional area, and a dielectric layer within the cavity.

In accordance with a fourth aspect of the invention, a memory cell is provided that includes a steering element having a first cross-sectional area, a reversible resistance switching element including a sidewall region and a bottom region that define a cavity, wherein the bottom region has a cross-sectional area less than the first cross-sectional area, and a conductive layer within the cavity.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIG. 3A is a cross-sectional view of a first exemplary embodiment of a memory cell in accordance with this invention;

FIG. 3B is a cross-sectional view as indicated by the line 3B-3B as shown in FIG. 3A;

FIG. 3C is a cross-sectional view as indicated by the line 3C-3C as shown in FIG. 3A;

FIG. 3D is a cross-sectional view of a second exemplary embodiment of a memory cell in accordance with this invention;

FIG. 3E is a cross-sectional view as indicated by the line 3E-3E as shown in FIG. 3D;

FIG. 3F is a cross-sectional view as indicated by the line 3F-3F as shown in FIG. 3D;

FIGS. 4A-4I illustrate cross-sectional views of a portion of a substrate during an exemplary fabrication of a single memory level in accordance with this invention;

DETAILED DESCRIPTION

Some carbon-based materials exhibit reversible resistivity switching properties that may be suitable for use in nonvolatile memories. As used herein, carbon-based materials may include amorphous carbon ("aC"), graphene, graphite, and other crystalline forms of carbon, either alone or in combination with secondary materials. Diamond-like carbon, which tends to appear at temperatures lower than 500° C., to be $sp^3$-hybridized, and to be amorphous with respect to long range order, also has been found to be switchable.

Carbon-based materials have demonstrated memory switching properties on lab-scale devices with a 100× separation between ON and OFF states and mid-to-high range resistance changes. Such a separation between ON and OFF states renders carbon-based materials viable candidates for memory cells in which the carbon-based material is coupled in series with vertical diodes, thin film transistors or other steering elements. For example, a metal-insulator-metal ("MIM") stack formed from a carbon-based material sandwiched between two metal or otherwise conducting layers may serve as a resistance change element for a memory cell.

Carbon-based materials are often deposited using plasma-enhanced chemical vapor deposition ("PECVD") techniques. Such material may have an "initial resistivity" (i.e., the resistivity of the material as formed) that may be low relative to the resistivities of the surrounding materials. As a result, a resistance change element that includes the carbon-based material may conduct a high initial current that is incompatible with a steering element used to control current flow through the resistance change element, such as an adjacent diode. Additionally or alternatively, the initial resistivity of the carbon-based material may require a high voltage and current to reset the material upon initial use.

To avoid these problems, methods and apparatus in accordance with this invention form a carbon-based reversible resistance switching element that has an increased resistance, and a switching current that is less than the maximum current capability of a steering element used to control current flow through the carbon-based reversible resistance switching element. In particular, methods and apparatus in accordance with this invention form a steering element, such as a diode, having a first cross-sectional area, coupled to a reversible resistance switching element (e.g., made from a carbon-based reversible-resistivity switching material, such as aC) having a second cross-sectional area smaller than the first cross-sectional area. A reduced cross-sectional area for the reversible resistance switching element increases a resistance of the reversible-resistance switching element, and thereby decreases initial current flow through the reversible-resistance switching element.

Exemplary Inventive Memory Cell

Figure 1:
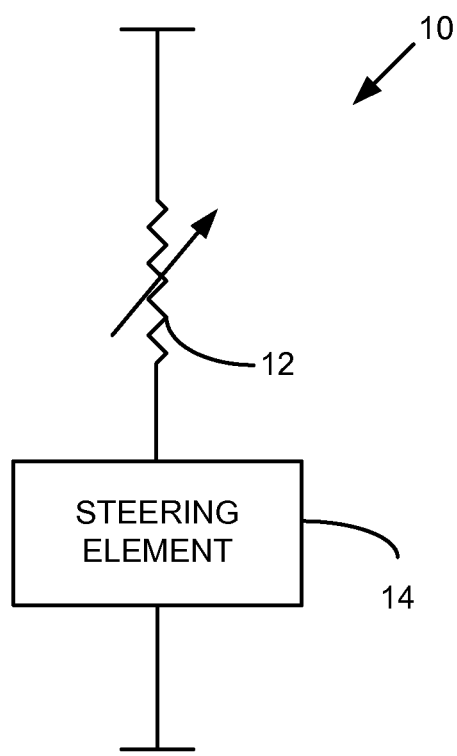
FIG. 1 is a diagram of an exemplary memory cell in accordance with this invention.

FIG. 1 is a schematic illustration of an exemplary memory cell 10 in accordance with this invention. Memory cell 10 includes a carbon-based reversible resistance switching element 12 ("carbon element 12") coupled to a steering element 14. Carbon element 12 includes a carbon-based reversible resistivity switching material (not separately shown) having a resistivity that may be reversibly switched between two or more states.

For example, reversible resistivity switching material of carbon element 12 may be in an initial, low-resistivity state upon fabrication. Upon application of a first voltage and/or current, the material is switchable to a high-resistivity state. Application of a second voltage and/or current may return reversible resistivity switching material to a low-resistivity state. Alternatively, carbon element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used. Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (hereinafter "the '939 application"), which is hereby incorporated by reference herein in its entirety for all purposes.

Steering element 14 may include a thin film transistor, a diode, or another similar steering element that exhibits non-ohmic conduction by selectively limiting the voltage across and/or the current flow through reversible resistance switching element 12. In this manner, memory cell 10 may be used as part of a two or three dimensional memory array and data may be written to and/or read from memory cell 10 without affecting the state of other memory cells in the array.

Exemplary embodiments of memory cell 10, carbon element 12 and steering element 14 are described below with reference to FIGS. 2A-2D.

Exemplary Embodiments of Memory Cells and Memory Arrays

Figure 2A:
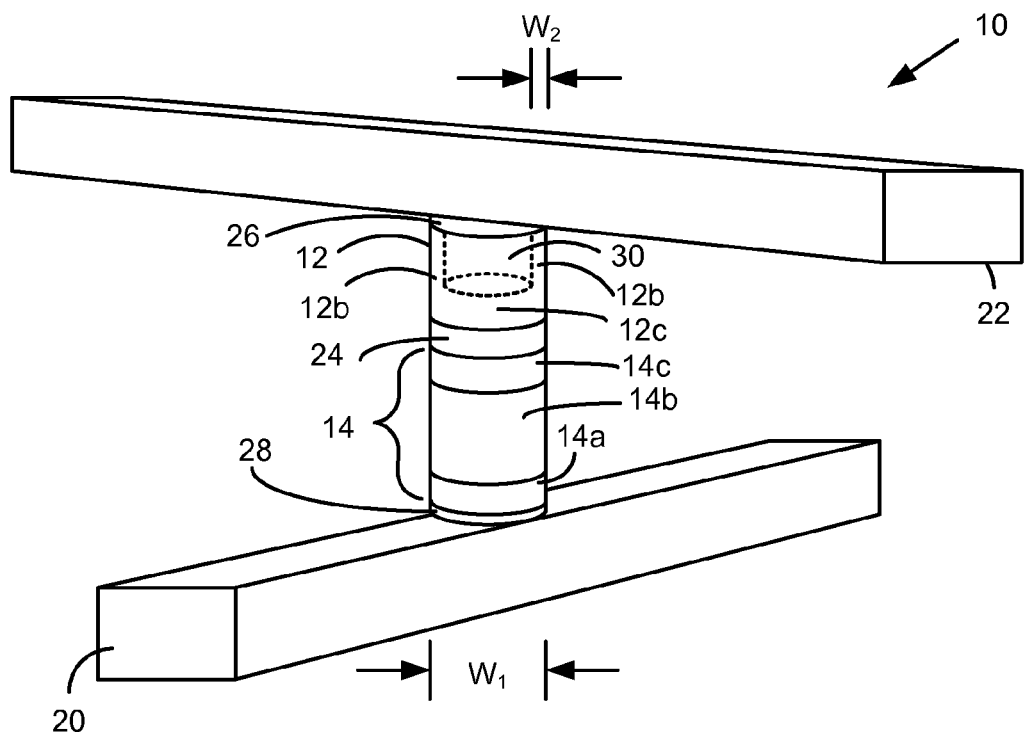
FIG. 2A is a simplified perspective view of an exemplary memory cell in accordance with this invention.

FIG. 2A is a simplified perspective view of an exemplary embodiment of a memory cell 10 in accordance with this invention in which steering element 14 is a diode. Memory cell 10 includes a carbon element 12 coupled in series with a diode 14 between a first conductor 20 and a second conductor 22. In some embodiments, a barrier layer 24 may be formed between carbon element 12 and diode 14, and a barrier layer 26 may be formed between carbon element 12 and second conductor 22. An additional barrier layer 28 also may be formed between diode 14 and first conductor 20. For example, barrier layers 24, 26 and 28 may include titanium, titanium nitride, tantalum, tantalum nitride, tungsten, tungsten nitride, molybdenum, or other similar barrier layer. In some embodiments, barrier layer 26 may be formed as part of second conductor 22.

Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed. Exemplary embodiments of diode 14 are described below with reference to FIGS. 3A-3B.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

As described in more detail below, diode 14 has a first cross-sectional area A1 (not shown). Carbon element 12 and memory cell 10 are fabricated so that current flows substantially through a region of carbon element 12 having a second cross-sectional area A2 (not shown) smaller than first cross-sectional area A1. Second cross-sectional area A2 is selected to be smaller than first cross-sectional area A1 so that the maximum switching current of carbon element 12 is less than the maximum current capability of diode 14. In accordance with this invention, second cross-sectional area A2 may be from about 10% to about 50%, more generally from about 10% to about 90% of first cross-sectional area A1. In at least one exemplary embodiment, second cross-sectional area A2 is about 25% of first cross-sectional area A1.

In at least some embodiments, carbon element 12 may include sidewall region 12b and a bottom region 12c, which define a cavity 30. In one exemplary embodiment, cavity 30 is substantially filled with a dielectric material. As a result, current flow through carbon element 12 occurs substantially in sidewall region 12b, which has a cross-sectional area A2 smaller than first cross-sectional area A1.

In an alternative exemplary embodiment, cavity 30 is substantially filled with a conductive material. As a result, current flow through carbon element 12 occurs substantially in bottom region 12c, which has a cross-sectional area A2 smaller than first cross-sectional area A1.

As will be described in more detail below, restricting current flow to either sidewall regions 12b or bottom region 12c effectively decreases the cross sectional area of the switching material that forms carbon element 12. As a result, the resistance of carbon element 12 increases, and initial current through carbon element 12 decreases.

Figure 2B:
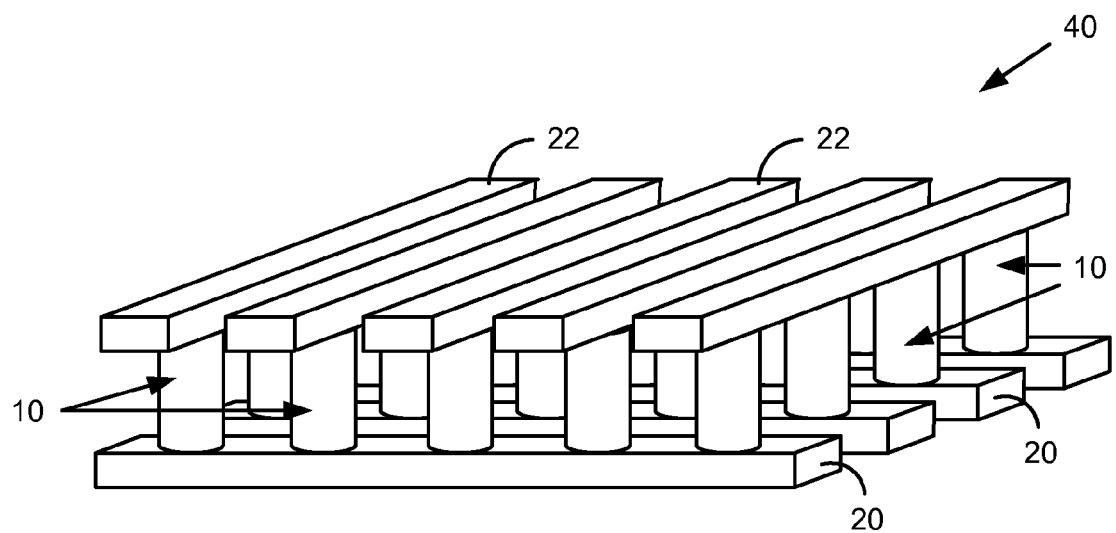
FIG. 2B is a simplified perspective view of a portion of a first exemplary memory level formed from a plurality of the memory cells of FIG. 2A.

FIG. 2B is a simplified perspective view of a portion of a first memory level 40 formed from a plurality of memory cells 10, such as memory cells 10 of FIG. 2A. For simplicity, carbon element 12, diode 14, and barrier layers 24, 26 and 28 are not separately shown. Memory array 40 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
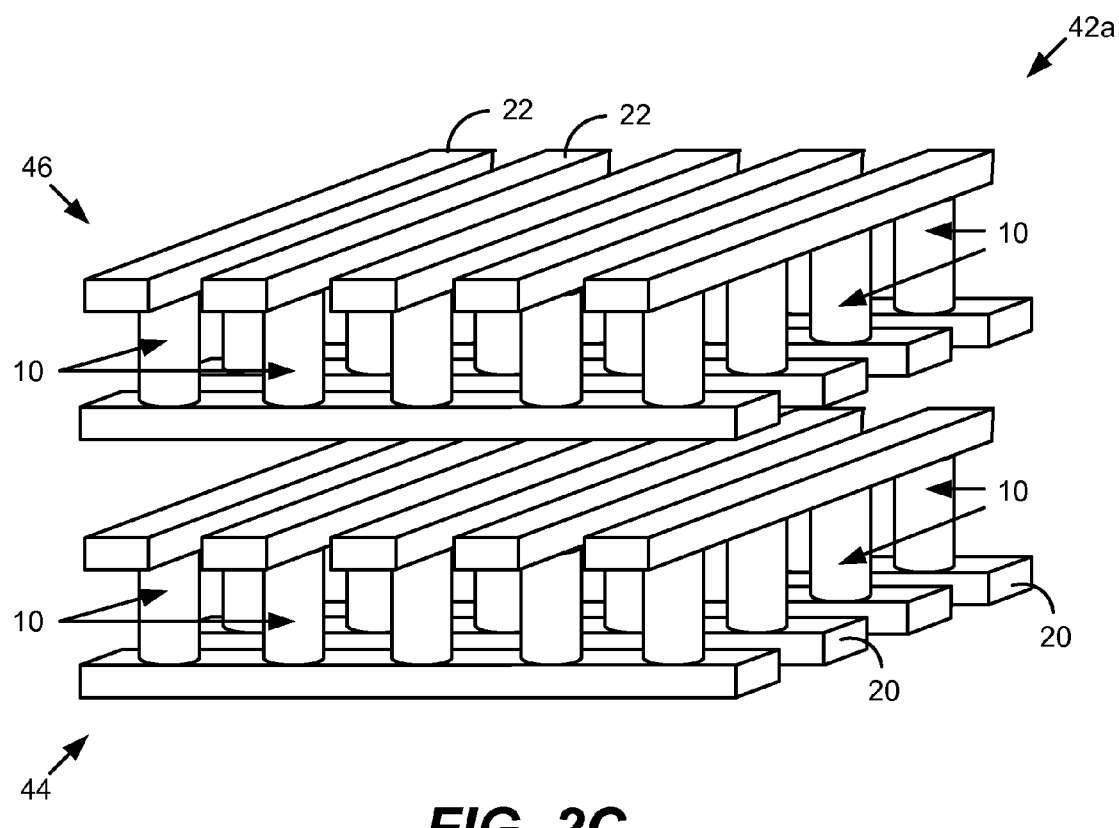
FIG. 2C is a simplified perspective view of a portion of a first exemplary three-dimensional memory array in accordance with this invention.

For example, FIG. 2C is a simplified perspective view of a portion of a monolithic three dimensional array 42a that includes a first memory level 44 positioned below a second memory level 46. Memory levels 44 and 46 each include a plurality of memory cells 10 in a cross-point array. Persons of ordinary skill in the art will understand that additional layers (e.g., an interlevel dielectric) may be present between the first and second memory levels 44 and 46, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
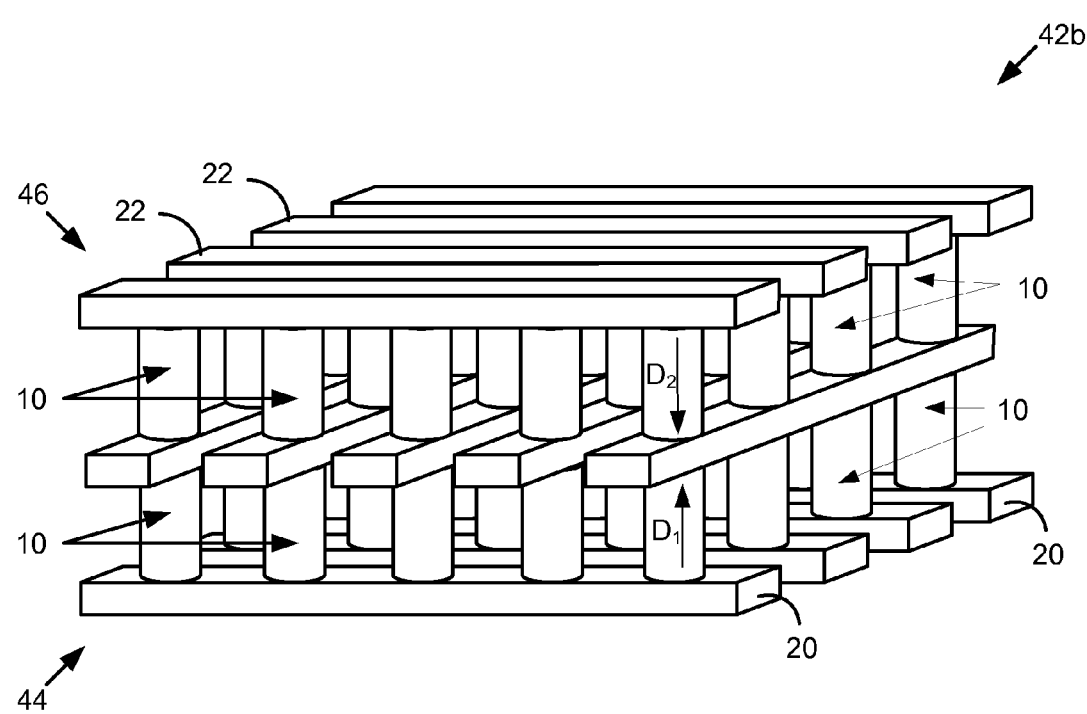
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in the alternative exemplary three dimensional array 42b illustrated in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (hereinafter "the '151 application"), which is hereby incorporated by reference herein in its entirety for all purposes. For example, as shown in FIG. 2D, the diodes of the first memory level 44 may be upward pointing diodes as indicated by arrow D1 (e.g., with p regions at the bottom of the diodes), whereas the diodes of the second memory level 46 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

As described above in connection with FIG. 2A, methods and apparatus in accordance with this invention form carbon element 12 so that its switching current is compatible with diode 14. In particular, methods and apparatus in accordance with this invention increase the resistance of carbon element 12 so that the maximum switching current of carbon element 12 is less than the maximum current capability of diode 14. As is well known, resistance is related to a material's resistivity, ρ, by the equation:

$$R = \rho t/A$$

where ρ=resistivity, t=material thickness and A=cross sectional area

As described above, restricting current flow to sidewall regions 12b or bottom region 12c of reversible resistance switching element 12 effectively decreases the current-conducting cross-sectional area of the switching material that forms carbon element 12. As a result, the resistance of carbon element 12 is increased. In this manner, the switching current of reversible-resistance switching element decreases.

As previously stated, any suitable carbon-based switching material may be used as carbon element 12. In some embodiments, a preferred resistivity of the material used to form carbon element 12 is at least $1 \times 10^3$ ohm-m when carbon element 12 is in an ON-state, whereas a preferred resistivity of the material used to form carbon element 12 is at least $1 \times 10^4$ ohm-m when carbon element 12 is in an OFF-state.

FIG. 3A is a cross-sectional view of a first exemplary embodiment of memory cell 10 of FIG. 2A. In particular, FIG. 3A shows an exemplary memory cell 10a which includes carbon element 12, diode 14, and first and second conductors 20 and 22, respectively. Memory cell 10a may also include barrier layers 26 and 28, a silicide layer 50, a silicide-forming metal layer 52, and dielectric layers 58 and 70, as well as adhesion layers, antireflective coating layers and/or the like (not shown) which may be used with first and/or second conductors 20 and 22, respectively, to improve device performance and/or facilitate device fabrication. As will be described in more detail below, diode 14 has a first cross-sectional area A1 and carbon element 12 includes sidewall region 12b that has a second cross-sectional area A2.

In FIG. 3A, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (hereinafter "the '331 application"), which is hereby incorporated by reference herein in its entirety for all purposes. In some embodiments, a few hundred angstroms or less of silicon-germanium alloy with about 10 at % or more of germanium may be employed.

A barrier layer 28, such as titanium, titanium nitride, tantalum, tantalum nitride, tungsten, tungsten nitride, molybdenum, etc., may be formed between the first conductor 20 and the n+ region 14a (e.g., to prevent and/or reduce migration of metal atoms into the polysilicon regions). Similarly, a barrier layer 26, such as titanium, titanium nitride, tantalum, tantalum nitride, tungsten, tungsten nitride, molybdenum, etc., may be formed between second conductor 22 and carbon element 12 to prevent and/or reduce migration of metal atoms into carbon element 12. In some embodiments, an additional metal layer (not shown) may be formed between barrier layer 26 and second conductor 22.

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c. In some embodiments, an additional nitride layer (not shown) may be formed at a top surface of silicide-forming metal layer 52. In particular, for highly reactive metals, such as titanium, an additional cap layer such as TiN layer may be formed on silicide-forming metal layer 52. Thus, in such embodiments, a Ti/TiN stack is formed on top of p+ polysilicon region 14c.

A rapid thermal anneal ("RTA") step may then be performed to form silicide regions by reaction of silicide-forming metal layer 52 with p+ region 14c. The RTA may be performed at about 540° C. for about 1 minute, and causes silicide-forming metal layer 52 and the deposited silicon of diode 14 to interact to form silicide layer 50, consuming all or a portion of the silicide-forming metal layer 52. As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 50 enhances the crystalline structure of silicon diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

In at least some embodiments, described in more detail with respect to FIGS. 4A-4I and FIGS. 5-7, carbon element 12 may be formed by forming a layer of reversible resistivity switching material within a via adjacent diode 14. The layer of reversible resistivity switching material may be formed to include a sidewall region 12b and a bottom region 12c that define a cavity 30. Sidewall region 12b may have a width $W_Y$.

In the embodiment of FIG. 3A, cavity 30 is substantially filled with a dielectric material. As a result, current I flowing through carbon element 12 flows substantially in sidewall region 12b, as shown in FIG. 3A.

As shown in FIGS. 3B and 3C, diode 14 and carbon element 12 have substantially circular cross-sectional shapes. Diode 14 has a width (and diameter) W1 and a first cross-sectional area A1. Accordingly, $$A1 = \pi \times (r1)^2 \quad (1)$$

where r1=(W1)/2.

Carbon element 12 includes sidewall region 12b that has a width $W_Y$ and a second cross-sectional area A2. As shown in FIG. 3B, second cross-sectional area A2 is substantially equal to the difference between an outer circle of radius r1=(W1)/2 and an inner circle of radius r2=[(W1)/2−$W_Y$]. Accordingly, $$A2 = \pi \times (r1)^2 - \pi \times (r2)^2 \quad (2)$$

where r2=[(W1)/2−$W_Y$]=(r1−$W_Y$).

Persons of ordinary skill in the art will understand that if diode 14 and carbon element 12 have non-circular cross-sectional shapes, alternative formulas may be used to calculate cross-sectional areas A1 and A2.

As described above, in accordance with this invention, second cross-sectional area A2 is selected to be smaller than first cross-sectional area A1, so that the maximum switching current of carbon element 12 is less than the maximum current capability of diode 14. Thus, width $W_Y$ of carbon element 12 is selected to be smaller than width W1 of diode 14. For example, if it is desired that A2=αA1, with α<1, then from equations (1) and (2), $$W_Y = (W1)/2 \times [1 - (1-\alpha)^{1/2}] \quad (3)$$

Thus, if α=0.25, $W_Y$=0.133975×W1. In various exemplary embodiments, W1 may be between about 10 nm and about 45 nm, more generally between about 10 nm and about 100 nm.

Accordingly, if $\alpha=0.25$, $W_Y$ may be between about 7 angstroms and about 3 nm, more generally between about 7 angstroms and about 7 nm. In one exemplary embodiment, W1 is about 43 nm and $W_Y$ is about 2.9 nm. Other W1 and/or $W_Y$ values may be used.

As described above, reversible resistance switching element 12 may be formed from a carbon-based material. For example, in some embodiments, reversible resistance switching element 12 is formed from an aC material. Any suitable thickness may be employed for the carbon-based material. In one embodiment, an aC material thickness of about 50-800 angstroms may be used. In some embodiments, a preferred thickness of the carbon material may be about 100-600 angstroms.

Table 1 below describes an exemplary process window for forming a carbon-based switching layer within a PECVD chamber using a processing gas comprising one or more hydrocarbon compounds and a carrier/dilutant gas. Persons of ordinary skill in the art will understand that the carrier gas may comprise any suitable inert or non-reactive gas such as one or more of He, Ar, $H_2$, Kr, Xe, $N_2$, etc. In some embodiments, the hydrocarbon compounds may have the formula $C_xH_y$, with x ranging from about 2 to 4, and y ranging from about 2 to 10.

TABLE 1

EXEMPLARY PECVD PROCESS PARAMETERS

| PROCESS PARAMETER | EXEMPLARY RANGE | PREFERRED RANGE |
|---|---|---|
| Precursor Flow Rate (sccm) | 10-5000 | 50-2000 |
| Carrier Flow Rate (sccm) | 10-10000 | 1000-7000 |
| Carrier/Precursor Ratio | 1:1-100:1 | 1:1-50:1 |
| Chamber Pressure (Torr) | 0.8-10 | 2.5-7 |
| $1^{st}$ RF frequency (Mhz) | 10-50 | 13.5 |
| $2^{nd}$ RF frequency (Khz) | 90-500 | 90 |
| RF Power Density (W/in$^2$) | 0.1-20 | 0.3-5 |
| $2^{nd}$ RF/$1^{st}$ RF Power Density Ratio | 0-1 | 0-0.5 |
| Process Temperature (° C.) | 100-900 | 300-550 |
| Electrode Spacing (Mils) | 200-1000 | 200-500 |

In particular embodiments, carbon-based switching materials may be formed to exhibit sheet resistance ("$\Omega/\square$" or "ohms/square") for a 1000 angstrom film from about $1\times10^4 \Omega/\square$ to about $1\times10^7 \Omega/\square$, and more preferably about $1\times10^4 \Omega/\square$ or greater. Similarly, some embodiments may comprise an aC film with nanocrystallites.

Other film parameters and characteristics may be pursued as well (e.g., alternate values of deposition rate, film thickness, sheet resistance/resistivity, etc.). For example, an exemplary carbon-based switching layer has the following characteristics:

TABLE 2

EXEMPLARY PECVD C-BASED FILM RESULTS

| PROCESS PARAMETER | EXEMPLARY RANGE | PREFERRED RANGE |
|---|---|---|
| Deposition Rate (Å/sec) | ≦33 | ≦5 |
| Total Film Thickness (Ang) | ≦1000 | ≦500 |
| Crystallinity (vol %) | >5% | >30% |
| Crystallinity Size (nm) | >1 | 2-10 |
| Sheet Resist. (ohm/square) | >1 × 10$^3$ | >1 × 10$^4$ |

Second conductor 22 may be formed above carbon element 12, as shown in FIGS. 3A and 3B. Second conductor 22 may include one or more barrier and/or adhesion layers 26 and a conductive layer 140.

FIG. 3D is a cross-sectional view of a second exemplary embodiment of memory cell 10 of FIG. 2A. In particular, FIG. 3D shows an exemplary memory cell 10b which includes carbon element 12, diode 14, and first and second conductors 20 and 22, respectively. Memory cell 10b may also include barrier layers 26 and 28, a silicide layer 50, a silicide-forming metal layer 52, and dielectric layer 58, as well as adhesion layers, antireflective coating layers and/or the like (not shown) which may be used with first and/or second conductors 20 and 22, respectively, to improve device performance and/or facilitate device fabrication.

In this embodiment, cavity 30 is substantially filled with a layer 70 of a conductor such as TiN. As a result, current I flowing through carbon element 12 flows substantially in bottom region 12c.

As shown in FIGS. 3E and 3F, diode 14 and carbon element 12 have substantially circular cross-sectional shapes. Diode 14 has a width (and diameter) W1 and a first cross-sectional area A1. Accordingly, $$A1 = \pi \times (r1)^2 \qquad (4)$$

where r1=(W1)/2. Bottom region 12c has a width $W_X$ and a second cross-sectional area A2. Accordingly, $$A2 = \pi \times (r3)^2 \qquad (5)$$

where r3=($W_X$)/2. Persons of ordinary skill in the art will understand that if diode 14 and reversible resistance switching element have non-circular cross-sectional shapes, alternative formulas may be used to calculate cross-sectional areas A1 and A2.

As described above, in accordance with this invention, second cross-sectional area A2 is selected to be smaller than first cross-sectional area A1, so that the maximum switching current of carbon element 12 is less than the maximum current capability of diode 14. Thus, width $W_X$ of carbon element 12 is selected to be smaller than width W1 of diode 14. For example, if it is desired that A2=αA1, with α<1, then from equations (4) and (5), $$W_X = \alpha^{1/2} \times W1 \qquad (6)$$

Thus, if $\alpha=0.25$, $W_X=0.5 \times W1$. In various exemplary embodiments, W1 is between about 10 nm and about 100 nm, and $W_X$ is between about 5 nm and about 50 nm. In other exemplary embodiments, W1 is between about 10 nm and about 45 nm, and $W_X$ is between about 5 nm and about 20 nm. In at least one exemplary embodiment, W1 is about 43 nm and $W_X$ is about 19 nm. In at least one alternative exemplary embodiment, W1 is about 24 nm and $W_X$ is about 12 nm. Other W1 and/or W2 values may be used.

Figure 3G:
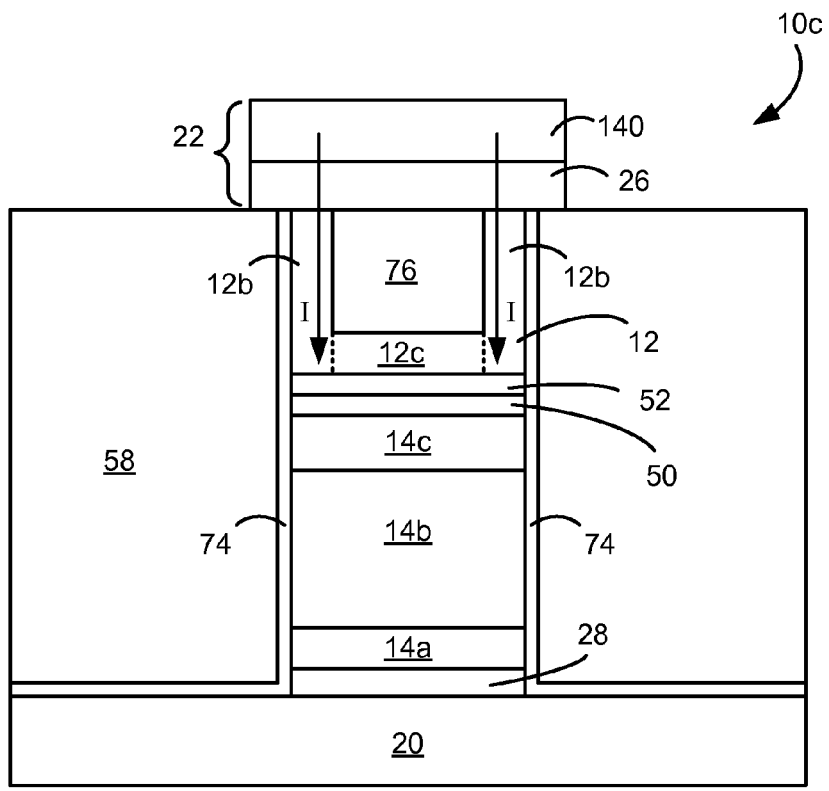
FIG. 3G is a cross-sectional view of a third exemplary embodiment of a memory cell in accordance with this invention.

FIG. 3G is a cross-sectional view of a third exemplary embodiment of memory cell 10 of FIG. 2A. In particular, FIG. 3G shows an exemplary memory cell 10c which includes carbon element 12, diode 14, and first and second conductors 20 and 22, respectively. Memory cell 10c is similar to memory cell 10a, but also includes a carbon liner 74, such as a metal oxide material that includes carbon impurities. Without wanting to be bound by any particular theory, it is believed that carbon liner 74 may enhance nucleation of carbon material on side walls of carbon liner 74, and in this regard may improve sidewall step coverage of carbon element 12.

Figure 3H:
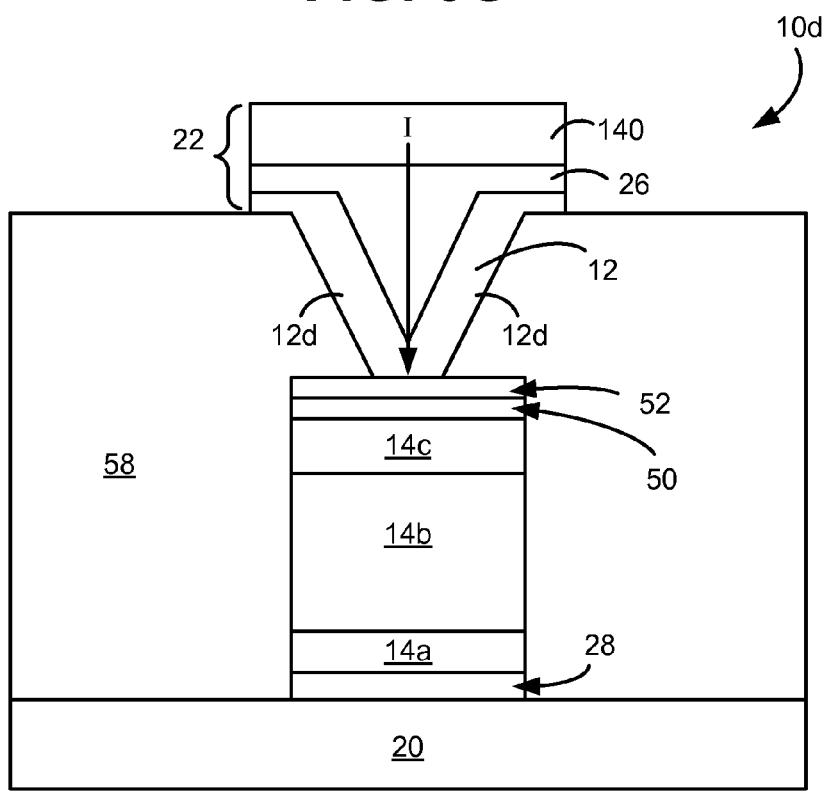
FIG. 3H is a cross-sectional view of a fourth exemplary embodiment of a memory cell in accordance with this invention.

FIG. 3H is a cross-sectional view of a fourth exemplary embodiment of memory cell 10 of FIG. 2A. In particular, FIG. 3H shows an exemplary memory cell 10d which includes carbon element 12, diode 14, and first and second conductors 20 and 22, respectively. Memory cell 10d is similar to memory cell 10b, but carbon element 12 is formed with tapered sidewalls 12*d*. Without wanting to be bound by any particular theory, it is believed that using tapered sidewalls 12*d* may enhance nucleation of carbon material on side walls 12*d*, and in this regard may improve sidewall step coverage of carbon element 12.

Exemplary Fabrication Processes for Memory Cells

Referring now to FIGS. 4A-4I, a first exemplary method of forming an exemplary memory level in accordance with this invention is described. In particular, FIGS. 4A-4I illustrate an exemplary method of forming an exemplary memory level including memory cells 10*a* of FIG. 3A. As will be described below, the first memory level includes a plurality of memory cells that each include a steering element having a first cross-sectional area. Each memory cell also includes a reversible resistance switching element coupled to the steering element, wherein the reversible resistance switching element has a region through which current substantially flows having a second cross-sectional area smaller than the first cross-sectional area. Additional memory levels may be fabricated above the first memory level (as described previously with reference to FIGS. 2C-2D).

Figure 4A:
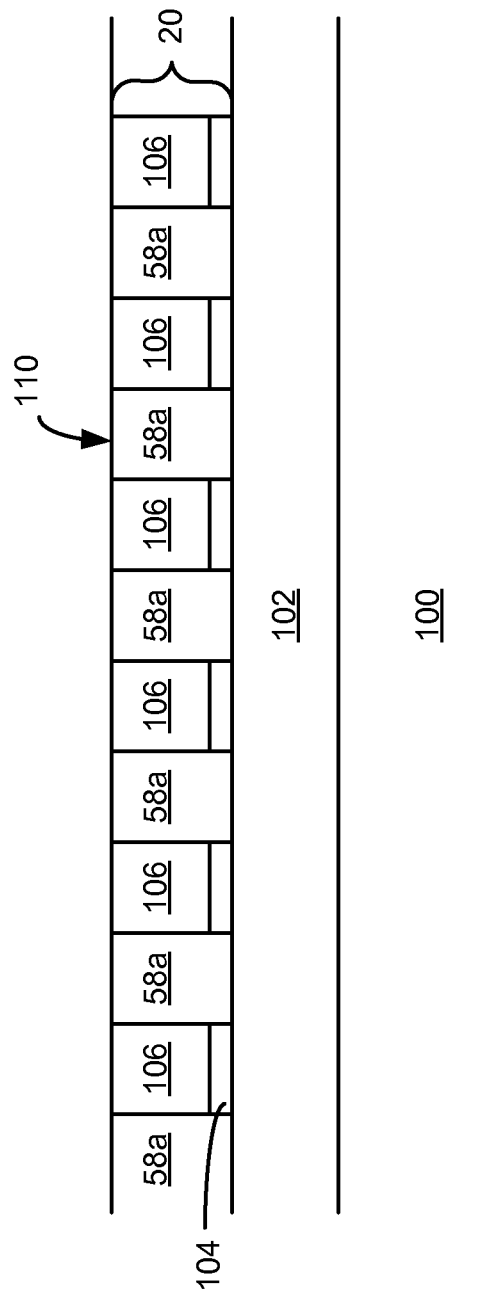

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), physical vapor deposition ("PVD"), etc.). In at least one embodiment, conductive layer 106 may comprise about 800 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58*a* is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58*a* is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
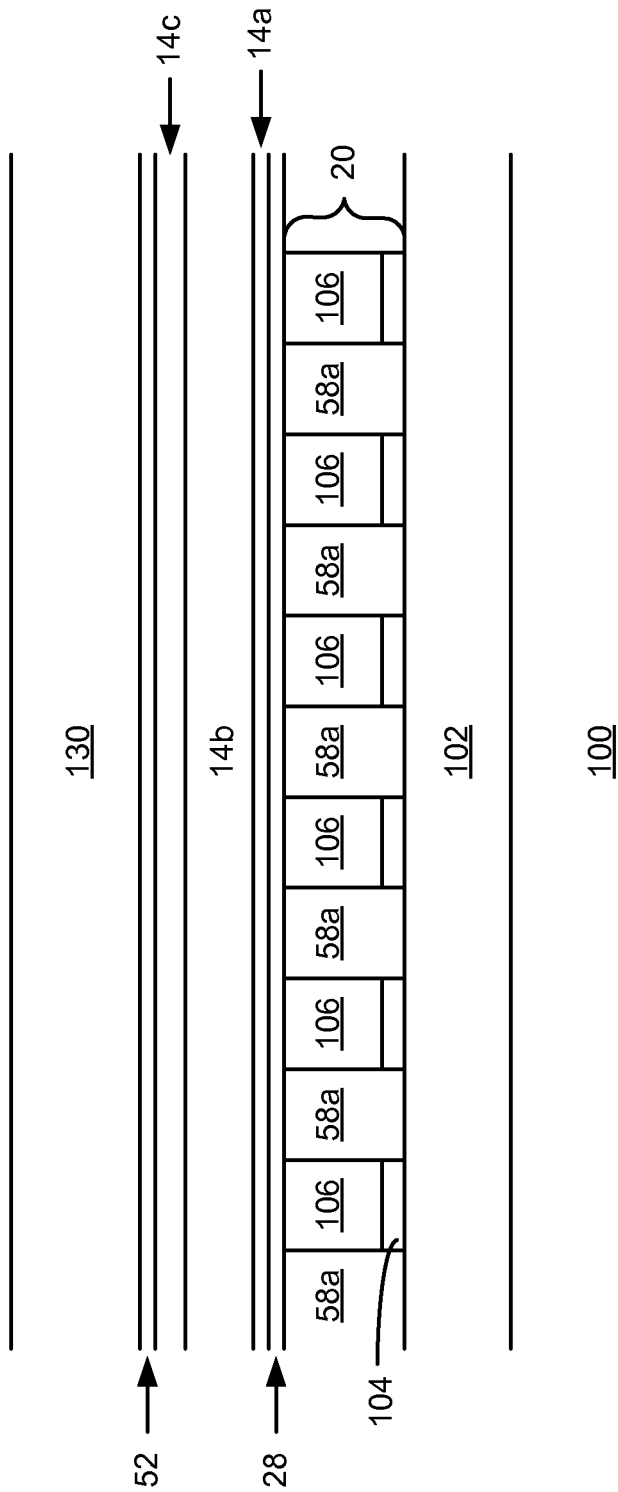

Following planarization, the diode structures of each memory cell are formed. With reference to FIG. 4B, a barrier layer 28 is formed over planarized top surface 110 of substrate 100. Barrier layer 28 may be about 20 to about 500 angstroms, and preferably about 100 angstroms, of carbon nitride ("$CN_x$"), titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 2 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14*a* is deposited on barrier layer 28. In some embodiments, n+ silicon layer 14*a* is in an amorphous state as deposited. In other embodiments, n+ silicon layer 14*a* is in a polycrystalline state as deposited. CVD or another suitable process may be employed to deposit n+ silicon layer 14*a*. In at least one embodiment, n+ silicon layer 14*a* may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14*a* may be doped in situ, for example, by flowing a donor gas during deposition. Other doping methods may be used (e.g., implantation).

After deposition of n+ silicon layer 14*a*, a lightly doped, intrinsic and/or unintentionally doped silicon layer 14*b* may be formed over n+ silicon layer 14*a*. In some embodiments, intrinsic silicon layer 14*b* may be in an amorphous state as deposited. In other embodiments, intrinsic silicon layer 14*b* may be in a polycrystalline state as deposited. CVD or another suitable deposition method may be employed to deposit intrinsic silicon layer 14*b*. In at least one embodiment, intrinsic silicon layer 14b may be about 500 to about 4800 angstroms, preferably about 1500-2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in the '331 application, previously incorporated).

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include $BF_2$, $BF_3$, B and the like. In some embodiments, an implant dose of about $1-5 \times 10^{15}$ ions/cm$^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used.

A layer 130 may be deposited over silicide-forming metal layer 52. As will be described below, layer 130 will be used in a Damascene process to form vias that will be filled with reversible resistivity switching material. In this regard, layer 130 is sometimes called a "sacrificial layer." In at least one embodiment, sacrificial layer 130 includes approximately 200 to 2000 angstroms, preferably 1200 angstroms of germanium may be deposited, although other materials may be used. Sacrificial layer 130 then may be planarized using chemical mechanical polishing or an etchback process to form a planar surface.

Figure 4C:
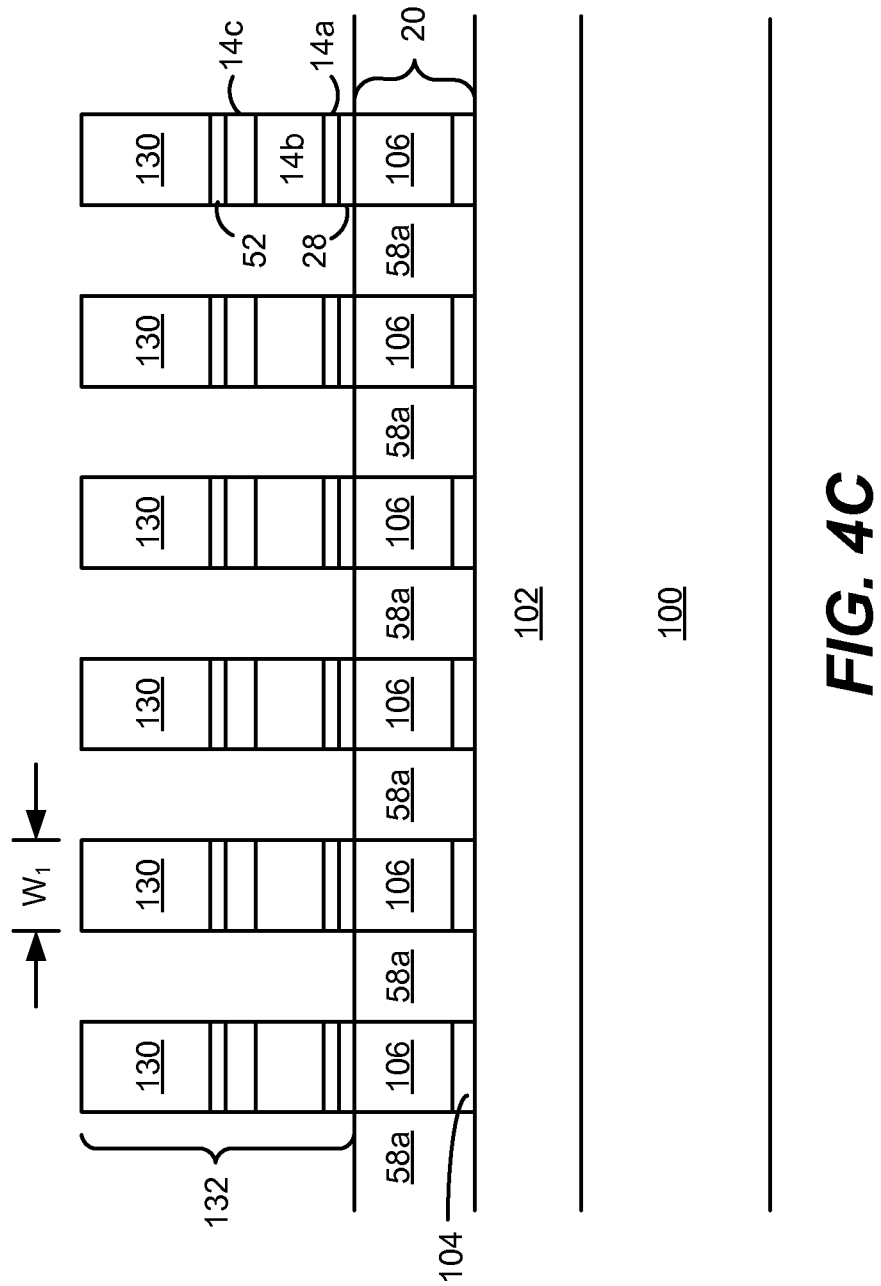
Figure 4D:
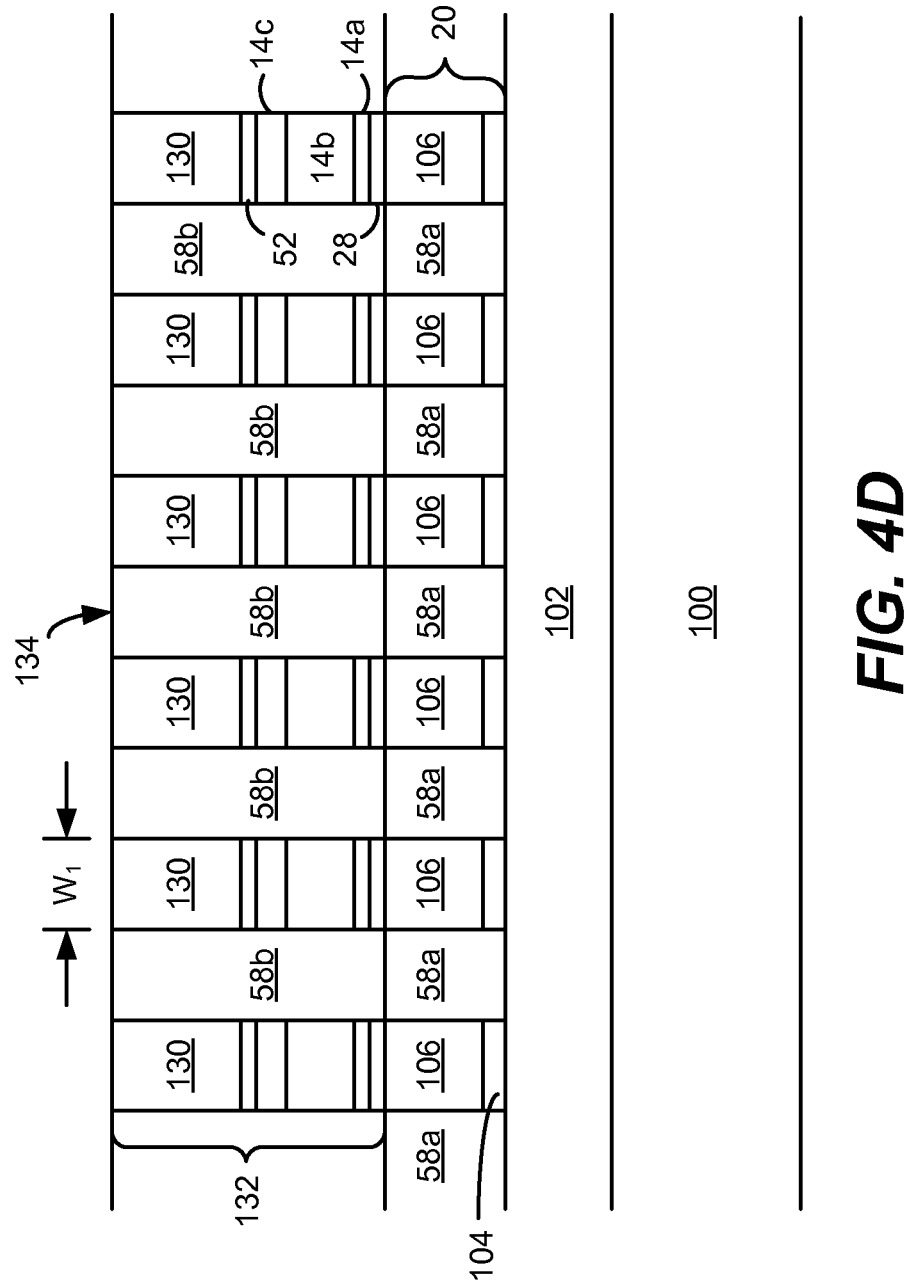

As shown in FIG. 4C, sacrificial layer 130, silicide-forming metal layer 52, diode layers 14a-14c and barrier layer 28 are patterned and etched to form pillars 132 having a width $W_1$. In some embodiments width W1 is about 10 nm to about 100 nm, and more preferably about 10 to about 45 nm. In at least one exemplary embodiment, W1 is about 43 nm.

After pillars 132 have been formed, a dielectric layer 58b may be deposited over pillars 132 to fill the voids between pillars 132. For example, approximately 2000-7000 angstroms of silicon dioxide may be deposited and planarized using chemical mechanical polishing or an etchback process to remove excess dielectric material 58b and form a planar surface 134, resulting in the structure illustrated in FIG. 4D. Planar surface 134 includes exposed top surfaces of pillars 132 separated by dielectric material 58b (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4E:
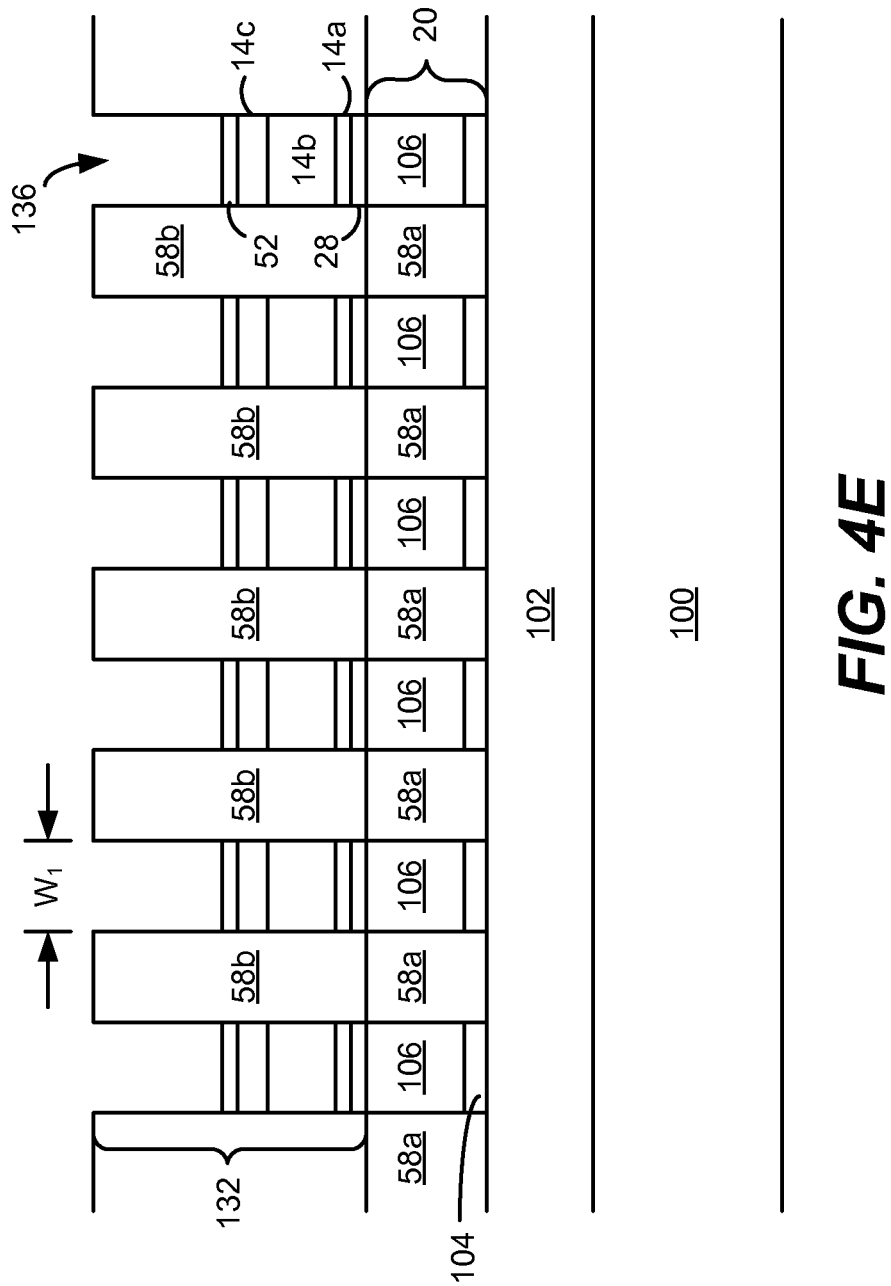

As shown in FIG. 4E, the patterned portions of sacrificial layer 130 are removed, such as by an aqueous solution (Germanium is generally soluble in water), to form vias 136 each having a width W1.

Figure 4F:
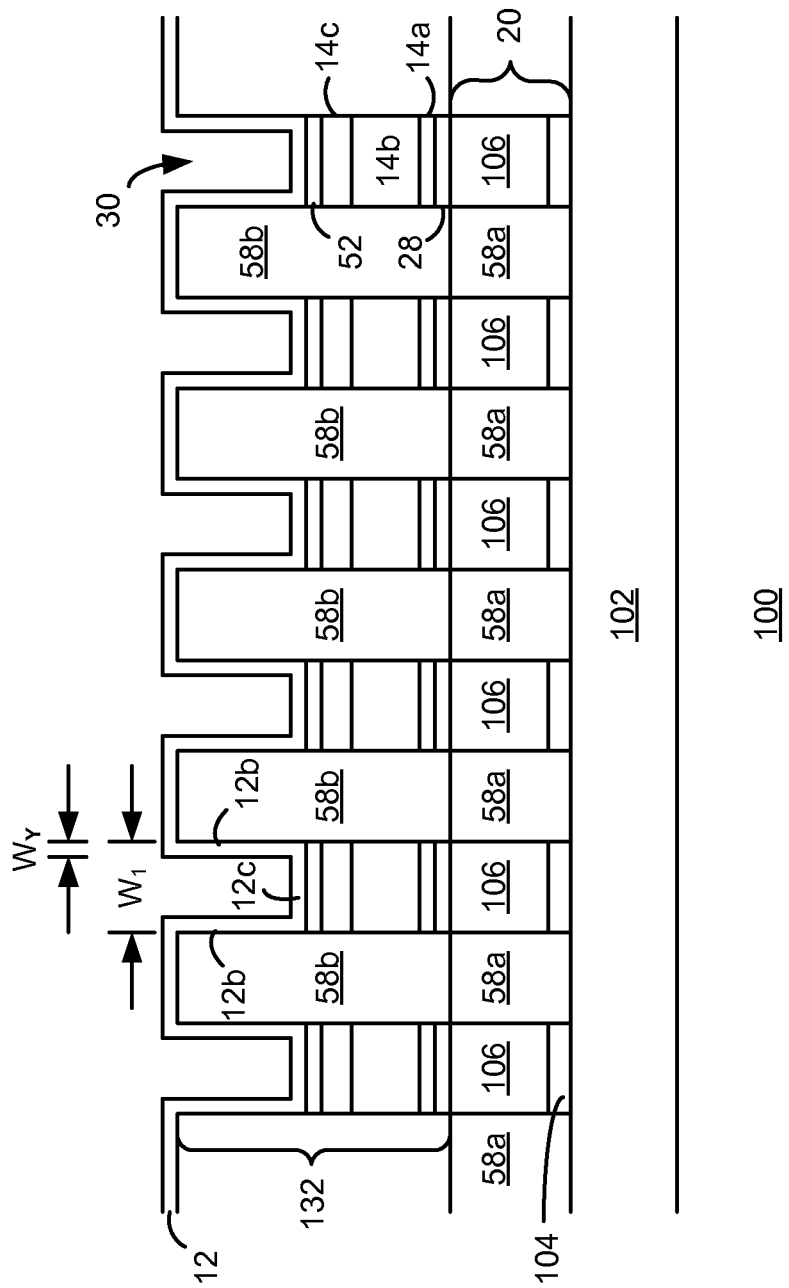

As shown in FIG. 4F, a conformal liner of a reversible resistivity switching material may be deposited on the top surfaces of the dielectric material 58b and on sidewall and bottom surfaces of vias 136, to form layer 12 of reversible resistivity switching material. Reversible resistivity switching layer 12 includes sidewall region 12b and bottom region 12c that define cavities 30 adjacent diodes 14. Reversible resistivity switching layer 12 may be formed from a carbon-based material such as aC, or another carbon-based resistivity switching material. For simplicity, reversible resistivity switching layer 12 will be referred to in the following discussion as "aC layer 12." In some embodiments, CVD, low pressure chemical vapor deposition ("LPCVD"), PECVD or another suitable process may be used to deposit aC layer 12. In at least one embodiment, aC layer 12 may have a sidewall thickness ranging, for example, from about 20 to about 100 angstroms, preferably from about 20 to about 50 angstroms. Other thicknesses may be used.

In at least some embodiments, aC layer 12 may be formed such that sidewall region 12b has width $W_Y$. As discussed above, width $W_Y$ may be selected so that a cross-sectional area of a region of reversible resistance switching element 12 through which current substantially flows is smaller than a cross-sectional area of diode 14, so that the maximum switching current of reversible resistance switching element 12 is less than the maximum current capability of diode 14. In various exemplary embodiments, W1 may be between about 10 nm and about 45 nm, more generally between about 10 nm and about 100 nm. Accordingly, if $\alpha=0.25$, $W_Y$ may be between about 7 angstroms and about 3 nm, more generally between about 7 angstroms and about 7 nm. In one exemplary embodiment, W1 is about 43 nm and $W_Y$ is about 2.9 nm. Other $W_1$ and/or $W_Y$ values may be used.

Each pillar 132 includes aC layer 12, and a p-i-n, downward-pointing diode 14. Persons of ordinary skill in the art will understand that upward-pointing p-i-n diodes may be similarly formed.

As shown in FIG. 4G, a dielectric layer 70 may be deposited above the reversible resistivity switching layer 12, substantially filling cavities 30 and covering top surfaces above dielectric material 58b. For example, approximately 1500 angstroms of silicon dioxide may be deposited. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4H:
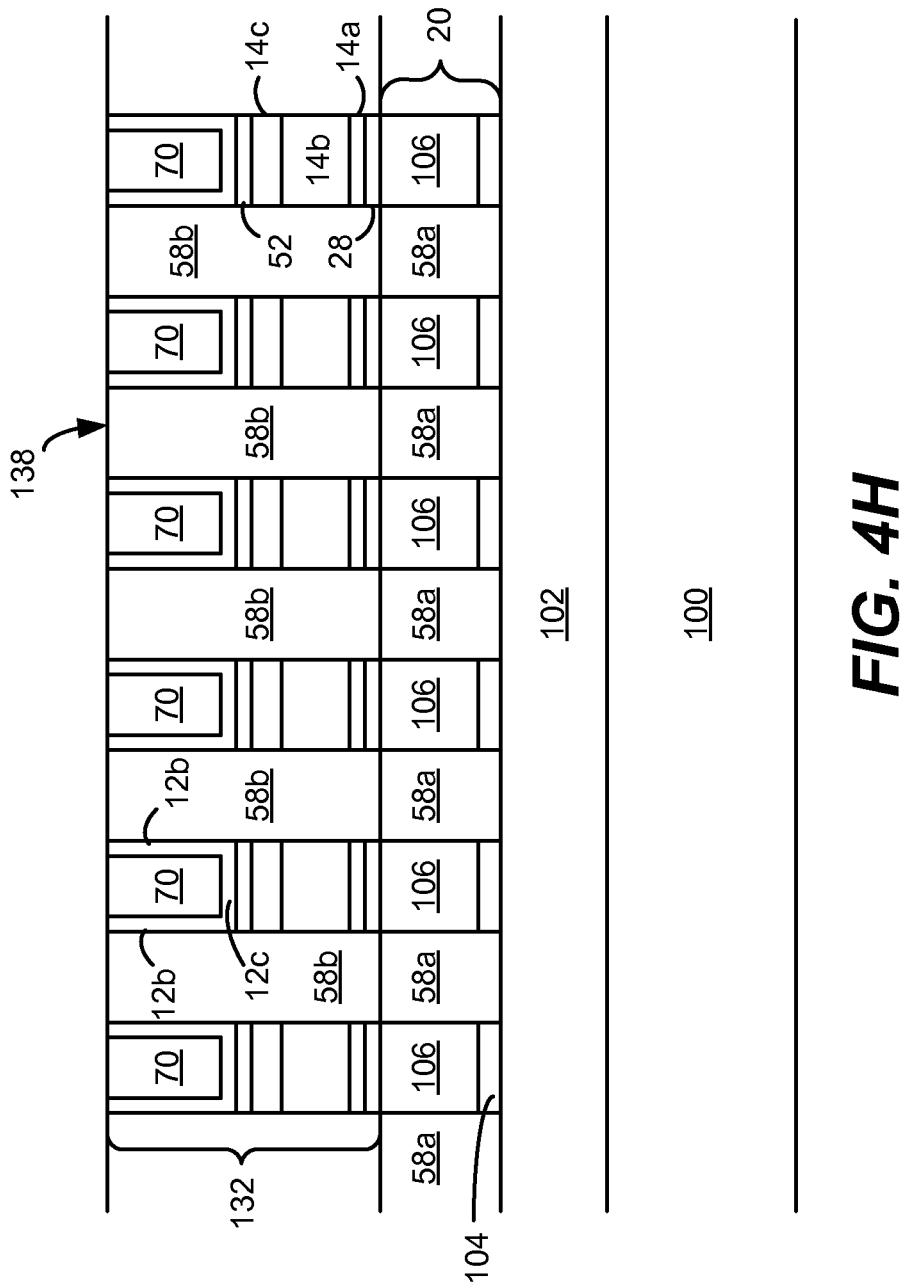

Dielectric layer 70 may be planarized using chemical mechanical polishing or an etchback process to form a planar surface 138, resulting in the structure illustrated in FIG. 4H. Planar surface 138 includes exposed portions of dielectric layer 70 and reversible resistivity switching layer 12, separated by dielectric material 58b (as shown).

Figure 4I:
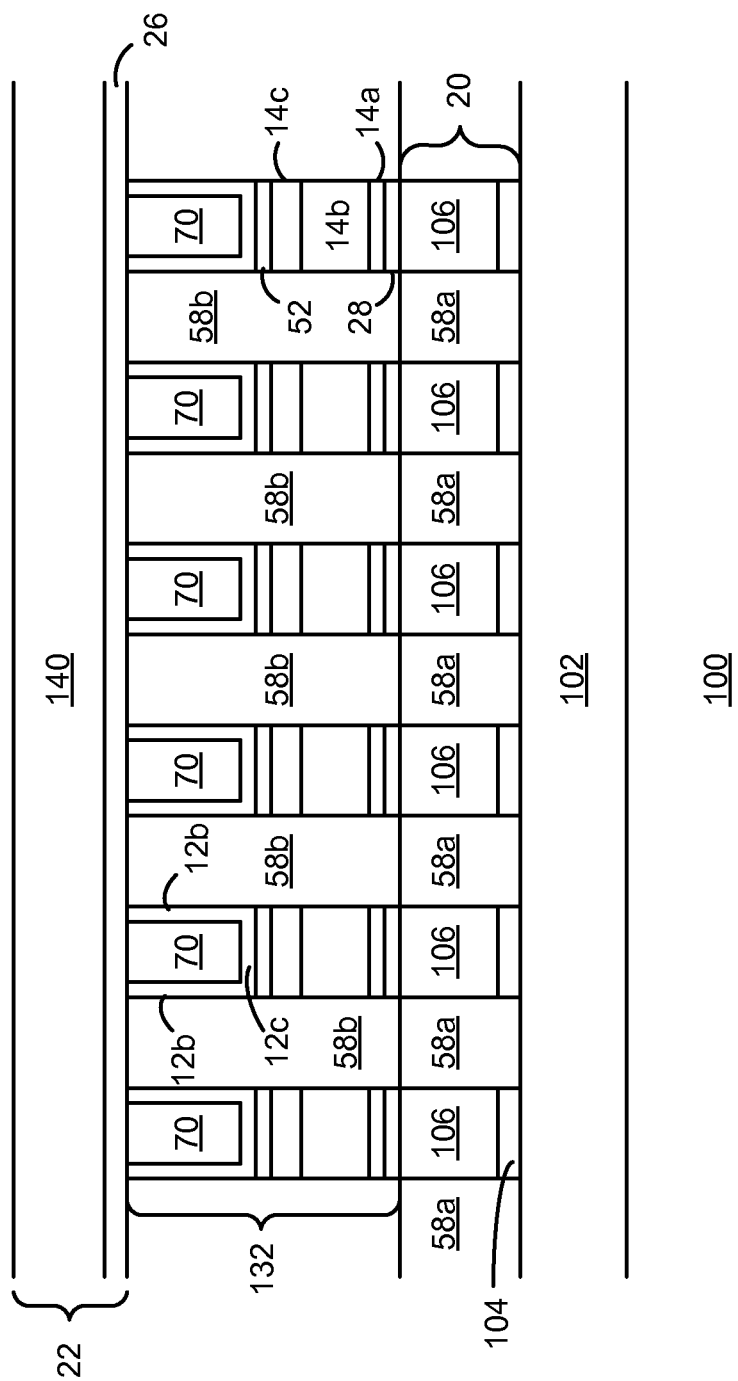

With reference to FIG. 4I, a second conductor 22 may be formed above pillars 132 in a manner similar to the formation of first conductors 20. For example, in some embodiments, one or more barrier layers and/or adhesion layers 26 may be deposited over pillars 132 prior to deposition of a conductive layer 140 used to form the second conductor 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s). In at least one embodiment, conductive layer 130 may comprise about 200 to about 2500 angstroms of tungsten, and barrier/adhesion layer 26 may comprise about 20 to about 500 angstroms of TiN. Other conductive layer and barrier layer materials may be used.

The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 52 and p+ region 14c react may serve as "crystallization templates" or "seeds" during annealing for underlying deposited semiconductor material that forms diodes 14 (e.g., changing any amorphous semiconductor material to polycrystalline semiconductor material and/or improving overall crystalline properties of diodes 14). Lower resistivity diode material thereby is provided.

Figure 5A:
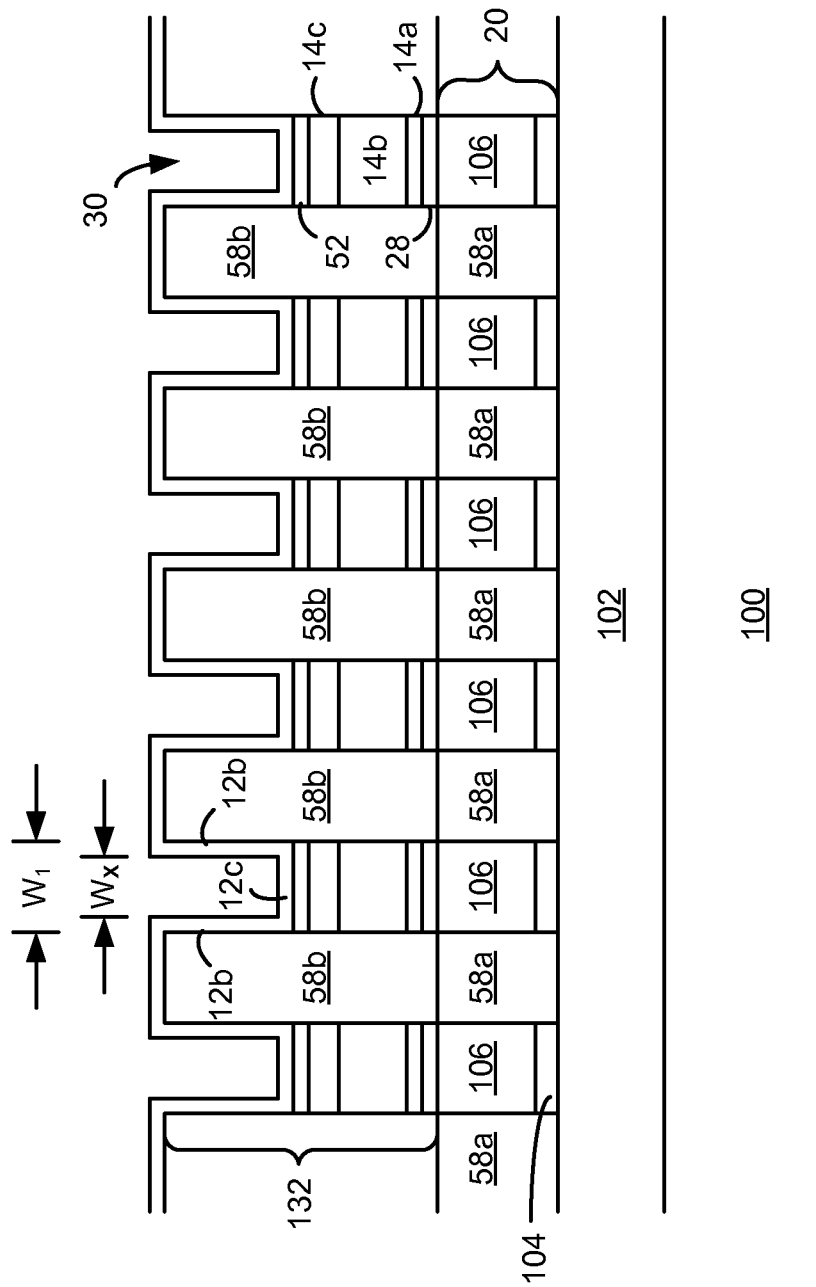
FIGS. 5A-5B illustrate cross-sectional views of a portion of a substrate during an alternative exemplary fabrication of a single memory level in accordance with this invention.
Figure 5B:
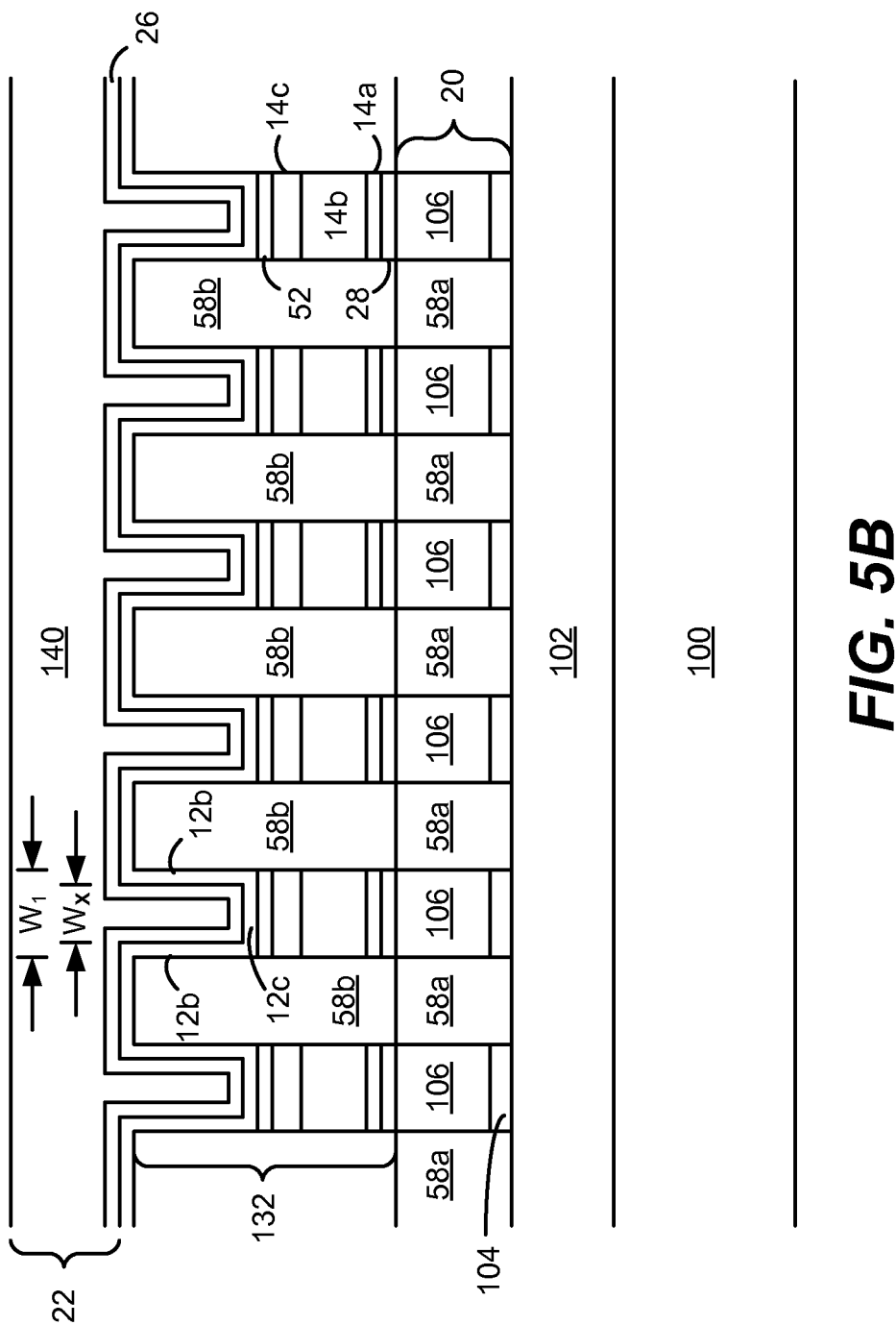

Referring now to FIGS. 5A-5B, an alternative exemplary method of forming an exemplary memory level in accordance with this invention is described. In particular, FIGS. 5A-5B illustrate an exemplary method of forming an exemplary memory level including memory cells 10b of FIG. 3B. With reference to FIG. 5A, substrate 100 is shown as having already undergone several processing steps, including formation of isolation layer 102, first conductors 20, dielectric backfill 58a, barrier layer 28, diode layers 14a-14c, silicide-forming metal layer 52, and aC layer 12, as described above in connection with FIGS. 4A-4F.

aC layer 12 includes sidewall region 12b and bottom region 12c that define cavities 30 adjacent diodes 14. In some embodiments, CVD, PECVD or another suitable process may be used to deposit aC layer 12. In at least one embodiment, aC layer 12 may have a sidewall thickness ranging, for example, from about 50 to about 500 angstroms, preferably from about 50 to about 100 angstroms. Other thicknesses may be used.

In at least some embodiments, aC layer 12 may be formed to have a bottom region 12c having a width $W_X$ selected to increase the resistance of reversible resistance switching element 12 so that the maximum switching current of reversible resistance switching element 12 is less than the maximum current capability of diode 14. In various exemplary embodiments, W1 is between about 10 nm and about 100 nm, and $W_X$ is between about 5 nm and about 50 nm. In other exemplary embodiments, W1 is between about 10 nm and about 45 nm, and $W_X$ is between about 5 nm and about 20 nm. In at least one exemplary embodiment, W1 is about 43 nm and $W_X$ is about 19 nm. In at least one alternative exemplary embodiment, W1 is about 24 nm and $W_X$ is about 12 nm. Other W1 and/or W2 values may be used.

As shown in FIG. 5B, second conductors 22, including conductive layer 140 and barrier/adhesion layer(s) 26, may be formed over reversible resistivity switching layer 12, substantially filling cavities 30 and covering top surfaces above dielectric material 58b. Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions formed as each silicide-forming metal layer region 52 and p+ region 14c react may serve as "crystallization templates" or "seeds" during annealing for underlying deposited semiconductor material that forms diodes 14 (e.g., changing any amorphous semiconductor material to polycrystalline semiconductor material and/or improving overall crystalline properties of diodes 14). Lower resistivity diode material thereby is provided.

Figure 6:
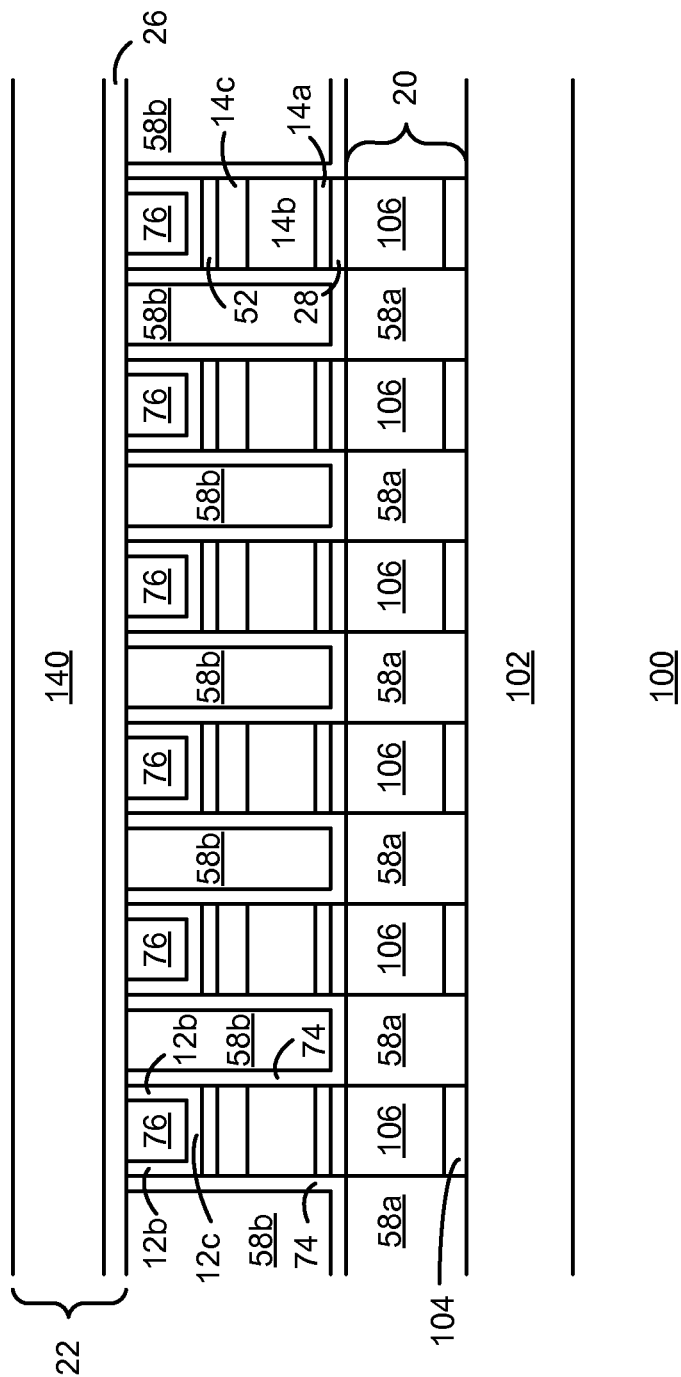
FIG. 6 illustrates a cross-sectional view of a portion of a substrate of an alternative exemplary single memory level in accordance with this invention.

Referring now to FIG. 6, an alternative exemplary memory level including memory cells 10c of FIG. 3G is described. The exemplary memory level includes a carbon liner 74 that may enhance nucleation of carbon material of aC layer 12 on side walls of carbon liner 74, and in this regard may improve sidewall step coverage of aC layer 12. For example, carbon liner 12 may be a silicon/metal carbide, a carbon-rich oxide, oxynitride, nitride or amorphous/crystallized carbon, or other similar carbon material, and may have a thickness between about 20 and 150 angstroms, more generally between about 5 and 1000 angstroms. Carbon liner 74 may be formed by atomic layer deposition ("ALD"), CVD, PECVD, LPCVD, or other similar techniques. As described above, without wanting to be bound by any particular theory, it is believed that carbon liner 74 may enhance nucleation of carbon material on side walls of carbon liner 74, and in this regard may improve sidewall step coverage of aC layer 12.

Figure 7:
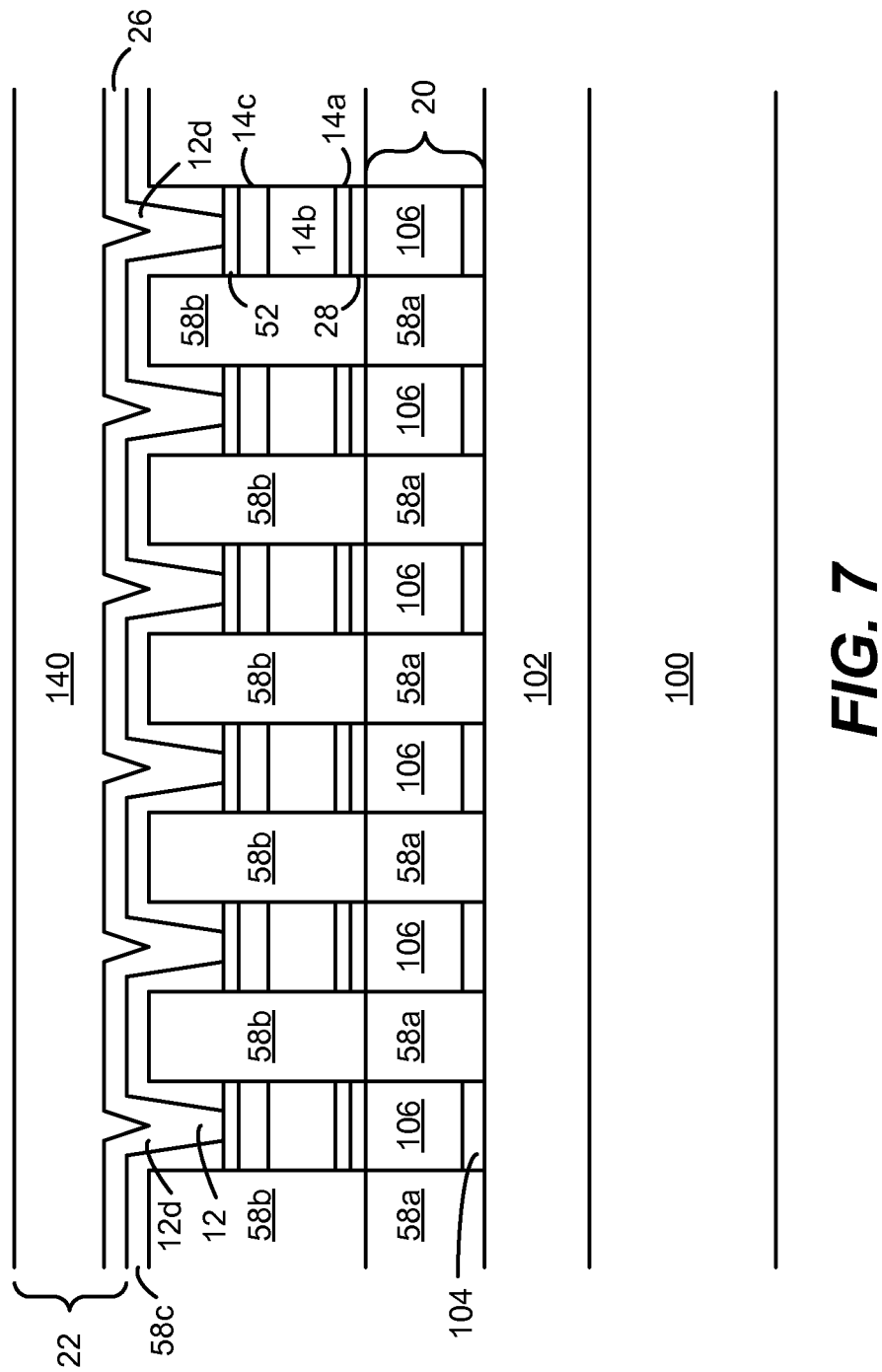
FIG. 7 illustrates a cross-sectional view of a portion of a substrate of an alternative exemplary single memory level in accordance with this invention.

Referring now to FIG. 7, an alternative exemplary memory level including memory cells 10d of FIG. 3H is described. In particular, the memory level includes aC layer 12 formed with tapered sidewalls 12d. As described above, without wanting to be bound by any particular theory, it is believed that tapered sidewalls 12d may enhance nucleation of carbon material on side walls 12d, and in this regard may improve sidewall step coverage of aC layer 12. Persons of ordinary skill in the art will understand that various techniques may be used to form tapered sidewalls 12*d* of ac layer 12. For example, a damascene trench may be formed above diode 14, and the trench may be filled with a low gap fill profile oxide 58*c* material to form a seam/interface in the center of the oxide fill area. The seam may be opened using an anisotropic etch, such as with a metal surface cleaning tool. An isotropic etch may be performed to open a contact to silicide layer 52, and thereby from tapered sidewalls of oxide 58*c*. aC layer 12 may then be deposited in the opening to form tapered sidewalls 12*d*.

Persons of ordinary skill in the art will understand that alternative memory cells in accordance with this invention may be fabricated in other similar techniques. For example, memory cells may be formed that include aC layer 12 below diode 14.

The foregoing description discloses only exemplary embodiments of the invention. Modifications of the above disclosed apparatus and methods which fall within the scope of the invention will be readily apparent to those of ordinary skill in the art. For instance, in any of the above embodiments, the carbon-based resistivity switching material may be located below the diodes 14. As stated, although the invention has been described primarily with reference to amorphous carbon, other carbon-based resistivity switching materials may be similarly used. Further, each carbon-based switching layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell comprising:
    forming a steering element having a first cross-sectional area and a first width;
    forming a reversible resistance switching element including a sidewall region and a bottom region that define a cavity, wherein the sidewall region has a second cross-sectional area smaller than the first cross-sectional area, and wherein the sidewall region has a second width between about 7 angstroms and about 7 nanometers; and
    forming a dielectric layer within the cavity.

2. The method of claim 1, wherein forming the steering element comprises forming a p-n or p-i-n diode.

3. The method of claim 1, wherein the reversible resistance switching element comprises a carbon-based material.

4. The method of claim 3, wherein the reversible resistance switching element comprises amorphous carbon.

5. The method of claim 1, wherein the first cross-sectional area is proportional to the first width squared.

6. The method of claim 1, wherein the first width is between about 10 nanometers and about 100 nanometers.

7. The method of claim 1, wherein the first width is between about 10 nanometers and about 45 nanometers.

8. The method of claim 1, wherein the first width is about 43 nanometers.

9. The method of claim 1, wherein the second cross-sectional area comprises is a function of the second width.

10. The method of claim 1, wherein the second width is between about 7 angstroms and about 3 nanometers.

11. The method of claim 1, wherein the second width is about 2.9 nanometers.

12. The method of claim 1, wherein forming the reversible resistance switching element comprises:
    forming a via adjacent the steering element; and
    forming a layer of a reversible resistivity switching material on a sidewall of the via.

13. The method of claim 12, wherein forming the via comprises using a damascene integration method.

14. The method of claim 1, further comprising forming a carbon liner on a sidewall of the reversible resistance switching element.

15. The method of claim 1, wherein the second cross-sectional area is between about 10% and 50% of the first cross-sectional area.

16. The method of claim 15, wherein the second cross-sectional area is about 25% of the first cross-sectional area.

17. A memory cell formed using the method of claim 1.

* * * * *